(12) United States Patent  
Kim et al.

(10) Patent No.: US 9,184,293 B2  
(45) Date of Patent: Nov. 10, 2015

(54) METHODS OF FABRICATING SEMICONDUCTOR DEVICES HAVING PUNCH-THROUGH STOPPING REGIONS

(71) Applicant: Samsung Electronics Co., Ltd., Suwon-si (KR)

(72) Inventors: Jong-Un Kim, Seoul (KR); Hyun-Seung Song, Incheon (KR); Dong-Hyun Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/454,943

(22) Filed: Aug. 8, 2014

(65) Prior Publication Data

US 2015/0044829 A1 Feb. 12, 2015

(30) Foreign Application Priority Data

Aug. 9, 2013 (KR) .................. 10-2013-0094775

(51) Int. Cl.
| | |
|---|---|
| H01L 27/20 | (2006.01) |
| H01L 29/78 | (2006.01) |
| H01L 21/266 | (2006.01) |
| H01L 21/8238 | (2006.01) |
| H01L 27/092 | (2006.01) |

(52) U.S. Cl.
CPC .......... *H01L 29/7851* (2013.01); *H01L 21/266* (2013.01); *H01L 21/823807* (2013.01); *H01L 21/823821* (2013.01); *H01L 27/0921* (2013.01); *H01L 27/0924* (2013.01)

(58) Field of Classification Search
CPC ....... H01L 29/66; H01L 29/78; H01L 29/785; H01L 29/66795; H01L 29/66937; H01L 29/66803; H01L 29/66818; H01L 29/78618

USPC .......... 438/283–289, 434; 257/E21.409, 444, 257/29.255

See application file for complete search history.

(56) References Cited

U.S. PATENT DOCUMENTS

| | | | |
|---|---|---|---|
| 5,268,312 A | 12/1993 | Reuss et al. | |
| 5,394,007 A | 2/1995 | Reuss et al. | |
| 5,608,253 A | 3/1997 | Liu et al. | |
| 6,403,430 B1 | 6/2002 | Clampitt | |
| 6,773,990 B1 | 8/2004 | Fastow et al. | |
| 7,662,679 B2 * | 2/2010 | Izumida et al. | 438/157 |
| 8,278,184 B1 | 10/2012 | Chen et al. | |
| 2005/0186742 A1 * | 8/2005 | Oh et al. | 438/283 |
| 2005/0272192 A1 * | 12/2005 | Oh et al. | 438/197 |
| 2009/0321836 A1 * | 12/2009 | Wei et al. | 257/365 |
| 2012/0086053 A1 * | 4/2012 | Tseng et al. | 257/288 |

(Continued)

FOREIGN PATENT DOCUMENTS

| | | |
|---|---|---|
| KR | 10-2005-0077926 A | 8/2005 |
| KR | 10-0668860 B1 | 1/2007 |

*Primary Examiner* — Michael Lebentritt

(74) *Attorney, Agent, or Firm* — Myers Bigel Sibley & Sajovec

(57) ABSTRACT

Methods of fabricating semiconductor devices are provided including providing a substrate having a first region and a second region, the substrate defining trenches in the first and second regions; forming active fins on the first and second regions, the active fins protruding from the trenches in the first and second regions; forming spacers on sidewalls of the active fins in the first and second regions; recessing floors of the trenches under the spacers to provide extensions of the active fins; implanting impurities of a first type in the extensions of the active fins in the first region; and implanting impurities of a second, type, different from the first type, in the extensions of the active fins in the second region.

19 Claims, 28 Drawing Sheets

(56) References Cited

U.S. PATENT DOCUMENTS

| | | | |
|---|---|---|---|
| 2012/0146159 A1* | 6/2012 | Wang et al. | 257/410 |
| 2012/0239399 A1* | 9/2012 | Yamazaki et al. | 704/243 |
| 2013/0032883 A1* | 2/2013 | Chan et al. | 257/365 |
| 2013/0183804 A1* | 7/2013 | Wang et al. | 438/285 |
| 2013/0280883 A1* | 10/2013 | Faul et al. | 438/434 |
| 2014/0054679 A1* | 2/2014 | Tang et al. | 257/329 |
| 2014/0061792 A1* | 3/2014 | Bu et al. | 257/347 |
| 2014/0159126 A1* | 6/2014 | Wei et al. | 257/288 |
| 2014/0199845 A1* | 7/2014 | Choi et al. | 438/696 |
| 2014/0312393 A1* | 10/2014 | Rodder et al. | 257/288 |
| 2014/0312432 A1* | 10/2014 | Ching et al. | 257/401 |
| 2014/0377926 A1* | 12/2014 | Kim et al. | 438/289 |

* cited by examiner

METHODS OF FABRICATING SEMICONDUCTOR DEVICES HAVING PUNCH-THROUGH STOPPING REGIONS

CROSS-REFERENCE TO RELATED APPLICATION

This application claims priority under 35 U.S.C. §119 to Korean Patent Application No. 10-2013-0094775, filed on Aug. 9, 2013, the disclosure of which is hereby incorporated by reference herein as if set forth in its entirety.

FIELD

Embodiments of the inventive concept relate generally to methods of fabricating semiconductor devices and, more particularly, to methods of fabricating semiconductor devices having punch-through stopping regions.

BACKGROUND

Recently, semiconductor devices installed in a mobile apparatus are required to be small, and therefore, highly integrated in order to satisfy the demand. Although a finFET that secures a sufficient channel length has been suggested according to the requirements of high-integration, these devices may experience punch-through between a source area and a drain area. Accordingly, methods of forming a high-concentration impurity area used as punch-through stopping area under an active fin have been suggested.

SUMMARY

Embodiments of the present inventive concept provide methods of fabricating semiconductor devices including a punch-through-stop ion-implantation process for reducing the likelihood of punch-through occurring between a source area and a drain area in a finFET. Further embodiments of the inventive concept provide methods of fabricating semiconductor devices capable of restricting an impurity-implantation area within lower parts of active fins that are not in contact with gate electrodes during an impurity-implantation process for reducing the likelihood of punch-through. Still further embodiments of the present inventive concept provide methods of fabricating semiconductor devices capable of reducing generation of defects in surfaces and insides of active fins during an impurity-implantation process.

Some embodiments of the present inventive concept provide methods of fabricating semiconductor devices including providing a substrate including a first region and a second region; forming trenches and protruding active fins on the first and second regions; forming spacers covering side surfaces of the active fins; forming extensions of the active fins under the spacers by recessing bottom surfaces of the trenches; implanting first impurities in the extensions of the active fins in the first region; and implanting second impurities in the extensions of the active fins in the second region.

In further embodiments, forming of the trenches and active fins may include forming hard mask patterns in which a nitride layer and an oxide layer are sequentially stacked on the first and second regions; and forming the trenches and the relatively protruding active fins by performing an etch process using the hard mask patterns as an etch mask.

In still further embodiments, forming of the spacers may include forming a spacer layer covering the hard mask patterns, the active fins, and the bottom surfaces of the trenches; and etching the spacer layer to expose top surfaces of the hard mask patterns, and the bottom surfaces of the trenches.

In some embodiments, each of the first and second regions may include one selected from a p-channel area and an n-channel area and include a different channel area from each other.

In further embodiments, when the first region includes the n-channel area, the implanting of the first impurities may include implanting p-type impurities in the extensions of the active fins.

In still further embodiments, implanting of the second impurities may include implanting n-type impurities in the extensions of the active fins in the second region.

In some embodiments, the implanting of the first and second impurities may include implanting impurities using a plasma ion-implantation process.

In further embodiments, the spacers may include a silicon nitride layer.

In still further embodiments, the method may further include forming a spacer oxide layer by performing an oxidation process on the spacer; and forming a trench oxide layer by an oxidation process on side surfaces of the extensions of the active fins.

In some embodiments, the method may further include etching side surfaces of the extensions of the active fins to have a concave shape.

Further embodiments of the present inventive concept may provide methods of fabricating semiconductor devices including providing a substrate including a first region and a second region; forming trenches and protruding active fins in the first and second regions; forming spacers covering side surfaces of the active fins; forming extensions of the active fins under the spacers by recessing bottom surfaces of the trenches; stacking a first impurity-implantation layer pattern and a first diffusion barrier layer pattern covering the active fins and trenches in the first region; implanting first impurities in the extensions of the active fins in the first region; stacking a second impurity-implantation layer pattern and a second diffusion barrier layer pattern covering the active fins and trenches in the second region; and implanting second impurities in the extensions of the active fins in the second region.

In still further embodiments, the stacking of the first impurity-implantation layer pattern and the first diffusion barrier layer pattern may include conformally forming a first impurity-implantation layer on the entire first and second regions; forming a first diffusion barrier layer on a top surface of the first impurity-implantation layer; forming an etch stopping layer covering the first region, removing the first impurity-implantation layer and the first diffusion barrier layer in the second region, and forming the first impurity-implantation layer pattern and the first diffusion barrier layer pattern under the etch stopping layer.

In some embodiments, the implanting of the first impurities may include diffusing impurities included in the first impurity-implantation layer pattern into the extensions of the active fins by applying heat to the substrate.

In still further embodiments, each of the first and second impurity-implantation layers may include one selected from a phosphosilicate glass (PSG) layer and a borosilicate glass (BSG) layer, and include a different impurity layer from each other.

In some embodiments, the first and second diffusion barrier layers may include silicon oxide layers.

Further embodiments of the present inventive concept provide methods of fabricating a semiconductor device including providing a substrate having a first region and a second region, the substrate defining trenches in the first and second regions; forming active fins on the first and second regions, the active fins protruding from the trenches in the first and second regions; and forming spacers on upper side surfaces of the active fins such that an impurity-implantation area is limited to lower portions of the active fins that are not covered by the spacers, wherein presence of the spacers on the upper side surfaces of the active fins reduces diffusion of impurities to a surface of the active fins.

In still further embodiments, the method may further include implanting first impurities in extensions of the active fins in the first region; and implanting second impurities, different from the first impurities, in the extensions of the active fins in the second region, wherein the implanting of the first and second impurities comprises implanting using plasma ion-implantation and a thermal diffusion process.

In some embodiments, the defects generated in surfaces and insides of the active fins during the implanting may be reduced by the use of plasma ion-implantation and thermal diffusion process.

In further embodiments, the lower portions of the active fins may have a relatively small width.

In still further embodiments, the method may further include a high-concentration impurity area in the lower portions of the active fins.

Details of other embodiments are included in the detailed description and drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIGS. 3A to 13B are cross sections illustrating processing steps in the fabrication of semiconductor devices in accordance with some embodiments of the inventive concept in a process order, wherein FIGS. 3A to 13A are taken along lines I-I' and II-II' in FIG. 1, respectively, and FIGS. 3B to 13B are taken along line III-III' in FIG. 1.

FIGS. 14A to 17B are cross sections illustrating processing steps in the fabrication of semiconductor devices in accordance with embodiments of the inventive concept in a process order, wherein FIGS. 14A to 17A are taken along lines I-I' and II-II' of FIG. 1, respectively, and FIGS. 14B to 17B are taken along line III-III' of FIG. 1.

FIGS. 18A to 26B are cross sections illustrating processing steps in the fabrication of semiconductor devices in accordance with some embodiments of the inventive concept in a process order, wherein FIGS. 18A to 26A are taken along lines I-I' and II-II' of FIG. 1, respectively, and FIGS. 18B to 26B are taken along line III-III' of FIG. 1.

DETAILED DESCRIPTION OF THE EMBODIMENTS

Figure 1:
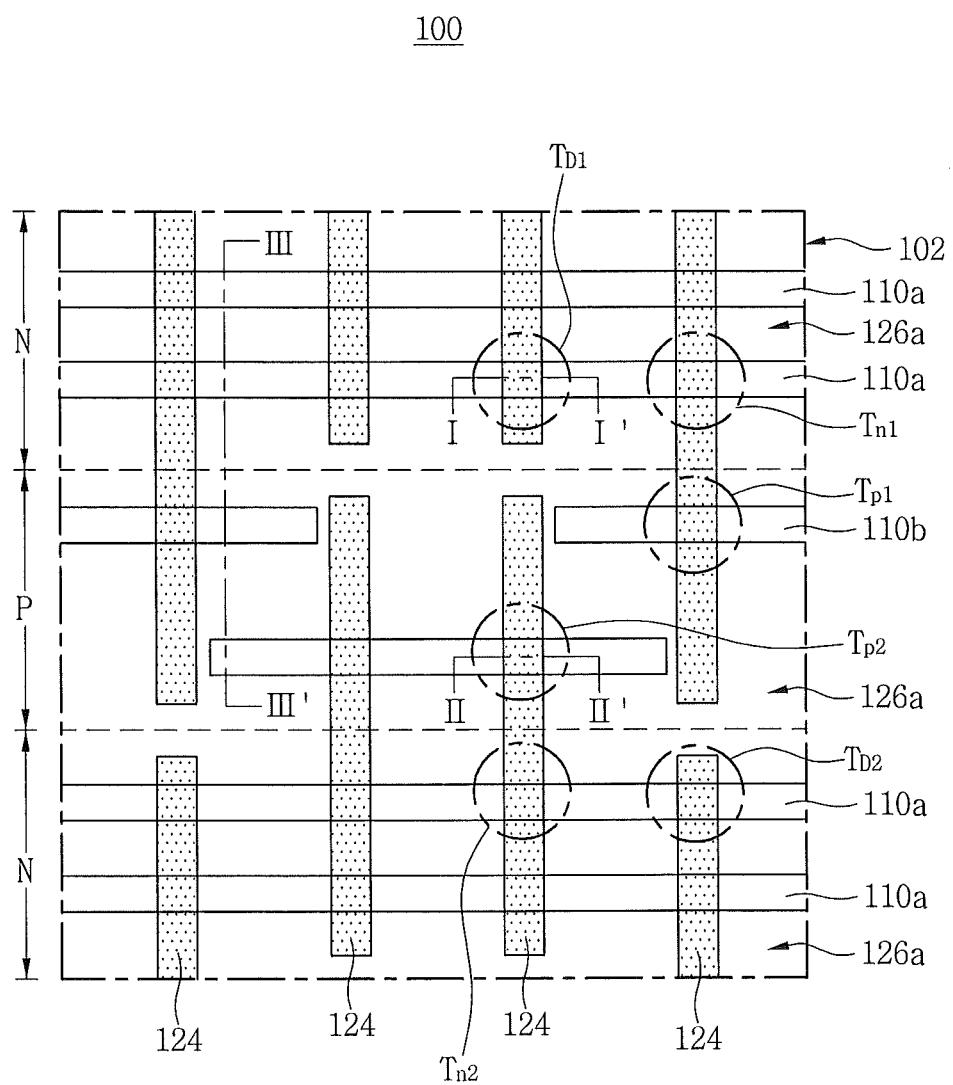
FIG. 1 is a schematic plan view illustrating semiconductor devices in accordance some embodiments of the inventive concept.

Various embodiments will now be described more fully with reference to the accompanying drawings in which some embodiments are shown. These inventive concept may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, a schematic plan view illustrating semiconductor devices in accordance with some embodiments of the inventive concept will be discussed. As illustrated in FIG. 1, a semiconductor device 100 may include a substrate 102 having a P-area P and an N-area N, first active fins 110a, second active fins 110b, gate electrodes 124, and device isolation layers 126a.

The first active fins 110a may be formed in a direction in the N-area N, and the second active fins 110b may be formed in a direction in the P-area P. The first active fins 110a formed in the N-area N may be spaced apart up and down, and extend in a first direction. The second active fins 110b formed in the P-area P may extend in the first direction, however, may be shorter than the first active fins 110a. The second active fins 110b may be spaced apart up and down, and left and right in the P-area P. Here, side surfaces of the second active fins 110b spaced apart up and down may not be vertically aligned. The first active fins 110a and the second active fins 110b may not be limited to the aforementioned forms and may be designed in various forms.

The device isolation layers 126a may define each area of the first and second active fins 110a and 110b, and electrically isolate the first and second active fins 110a and 110b from each other. The gate electrodes 124 may be formed to intersect the first active fins 110a and the second active fins 110b. Intersection areas of the gate electrodes 124 and the first and second active fins 110a and 110b may be areas at which transistors are formed. For example, a non-volatile memory device may include a unit cell consisting of two driving transistors, two n-type transistors, and two p-type transistors.

Accordingly, the unit cell of the non-volatile memory device may be designed as illustrated in FIG. 1. In particular, the intersection areas of the gate electrodes 124 and the first and second active fins 110a and 110b may be designed to be a first driving transistor area $T_{D1}$, an n-type first transistor area $T_{N1}$, a p-type first transistor area $T_{P1}$, a second driving transistor area $T_{D2}$, an n-type second transistor area $T_{N2}$, and a p-type second transistor area $T_{P2}$.

The first driving transistor area $T_{D1}$, the second driving transistor area $T_{D2}$, the n-type first transistor area $T_{N1}$, and the n-type second transistor area $T_{N2}$ may be defined in the N-area N of the substrate 102, and the p-type first transistor area $T_{P1}$ and the p-type second transistor area $T_{P2}$ may be defined in the P-area P of the substrate 102.

Figure 2A:
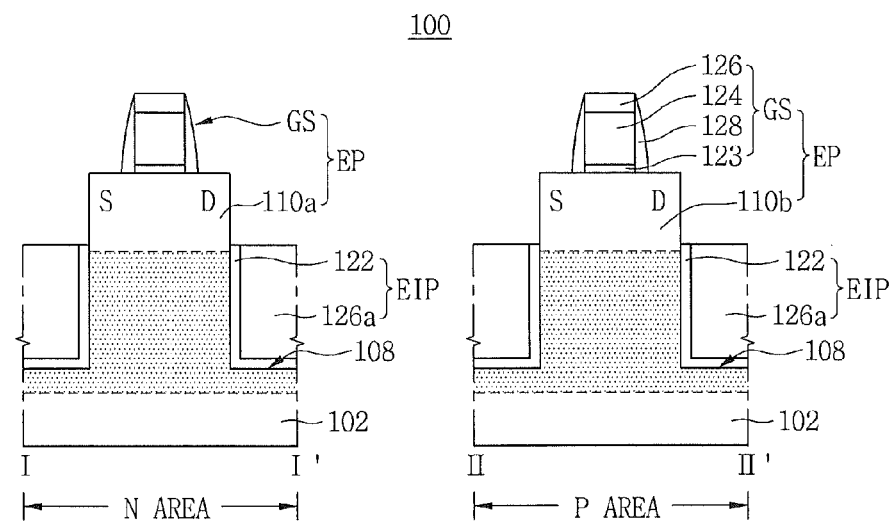
FIG. 2A is a cross-section taken along lines I-I' and II-II' in FIG. 1.
Figure 2B:
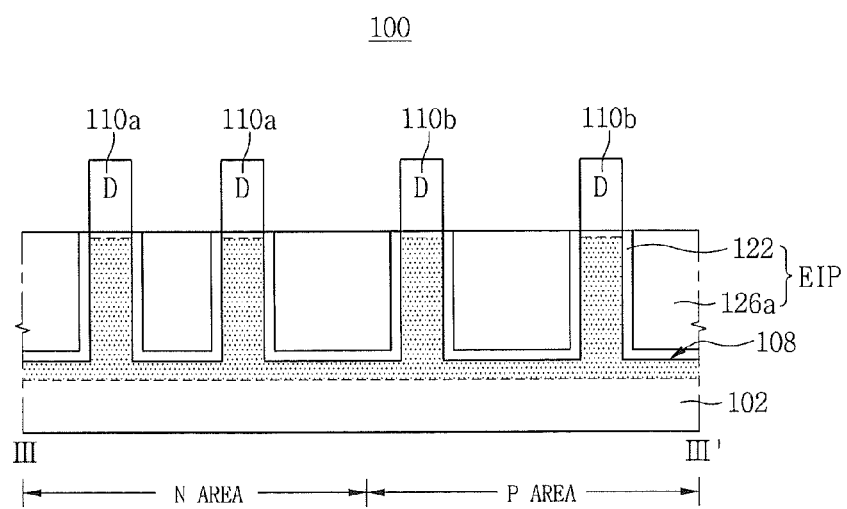
FIG. 2B is a cross-section taken along line III-III' in FIG. 1.

FIG. 2A is a cross section taken along lines I-I' and II-II' in FIG. 1, and FIG. 2B is a cross section taken along line III-III' in FIG. 1. Referring to FIGS. 2A and 2B, a semiconductor 100 in accordance with some embodiments of the inventive concept may include a substrate 102, a device isolation part EIP, and a device part EP.

The substrate 102 may include an N-area and a P-area. The device isolation part EIP may include trenches 108, trench oxide layers 122 covering inner walls of the trenches 108, and device isolation layers 126a filling the trenches 108. In some embodiments, silicon nitride layers covering the trench oxide layers 122 may be further included.

The device part EP may include first and second active fins 110a and 110b protruding from the substrate 102, and gate stacks GS intersecting the first and second active fins 110a and 110b. The device part EP may further include a source area S and a drain area D formed in the first and second active fins 110a and 110b at both sides of the gate stacks GS. In some embodiments, the source area S and the drain area D may be epitaxially grown areas.

The first active fins 110a and the second active fins 110b may have relatively protruding shapes since a surface of the substrate 102 is recessed in a process of forming the trenches 108. Impurity areas (indicated in the figures by dots) for punch-through stop may be formed in lower parts of the first and second active fins 110a and 110b in which the source area S and the drain area D are not formed.

The gate stacks GS may include gate dielectric layers 123, gate electrodes 124, gate capping layers 126, and sidewall spacers 128. The gate dielectric layers 123 may be formed between the gate electrodes 124 and the first and second active fins 110a and 110b. The gate electrode 124, referring to FIG. 1, may be formed to intersect the first and second active fins 110a and 110b. The remaining portions of the gate electrodes 124, which do not intersect the first and second active fins 110a and 110b, may have surfaces in contact with the device isolation layers 126a.

The gate capping layer 126 may be formed on an upper surface of the gate electrode 124, and the sidewall spacer 128 may be formed on each side surface of the gate electrode 124.

The substrate 102 may include, for example, silicon. The device isolation layers 126a may include silicon oxide layers. The gate dielectric layers 123 may include silicon oxide layers. The gate electrodes 124 may include polysilicon layers. The gate capping layers 126 and the side spacers 128 may include silicon nitride layers.

The process of fabricating the semiconductor device having the aforementioned configurations may include a punch-through-stop ion-implantation process to form a high-concentration impurity area (indicated in the figures by dots) in the lower parts of the first and second active fins 110a and 110b, in order to reduce, or possibly, prevent punch-through from occurring between the source area S and the drain area D illustrated in FIGS. 2A and 2B.

Hereinafter, with reference to the drawings, methods of fabricating semiconductor devices in accordance with embodiments of the inventive concept, which include a punch-through stop ion-implantation process, will be discussed.

FIGS. 3A to 13B are cross sections illustrating processing steps in the fabrication of semiconductor devices in accordance with some embodiments of the inventive concept in a process order, wherein FIGS. 3A to 13A are taken along lines I-I' and II-II' in FIG. 1, respectively, and FIGS. 3B to 13B are taken along line III-III' in FIG. 1.

Figure 3A:
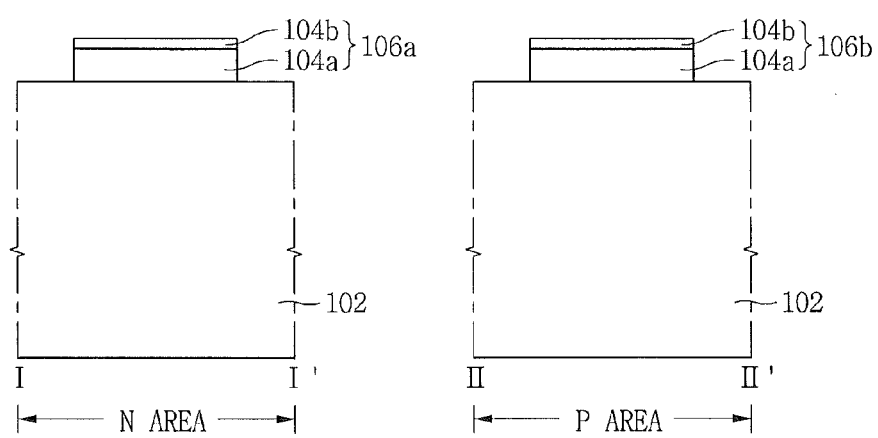
Figure 3B:
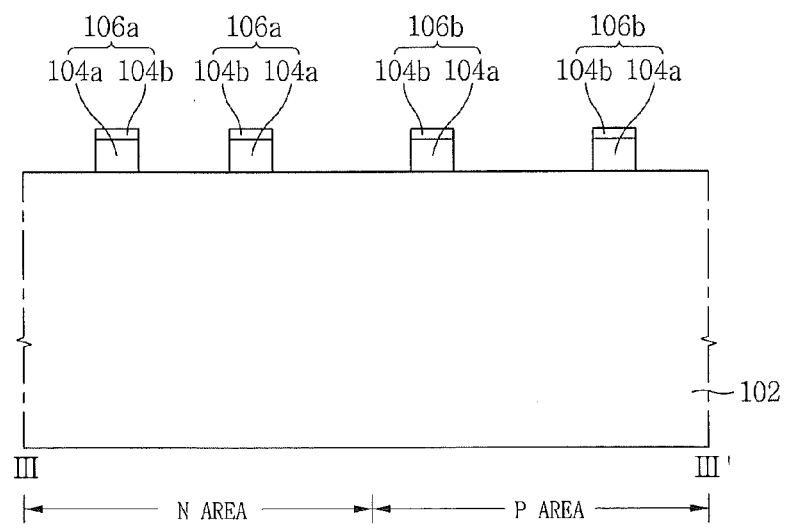

Referring to FIGS. 3A and 3B, a method of fabricating a semiconductor device 100 in accordance with some embodiments of the inventive concept may include defining a P-area and an N-area in a single substrate 102, and forming first hard mask patterns 106a in the N-area and second hard mask patterns 106b in the P-area. In some embodiments, the P-area may be a p-channel region, and a p-type transistor may be formed therein. Similarly, the N-area may be an n-channel region, and an n-type transistor may be formed therein.

The first hard mask patterns 106a and the second hard mask patterns 106b may be formed to have the same patterns as the first active fins 110a and the second active fins 110b illustrated in FIG. 1.

The substrate 102 may be, for example, a silicon substrate. Each of the first hard mask patterns 106a and the second hard mask patterns 106b include stacked silicon nitride patterns 104a and silicon oxide patterns 104b. The silicon nitride patterns 104a may include silicon nitride ($SiN_x$), and the silicon oxide patterns 104b may include silicon oxide ($SiO_2$).

The silicon nitride patterns 104a and the silicon oxide patterns 104b may be formed using, for example, chemical vapor deposition (CVD). In particular, the CVD process of forming the silicon oxide patterns 104b may include a middle thermal oxidation (MTO) process, which is a thermal oxidation process carried out at a temperature of from about 720° C. to about 780° C.

Figure 4A:
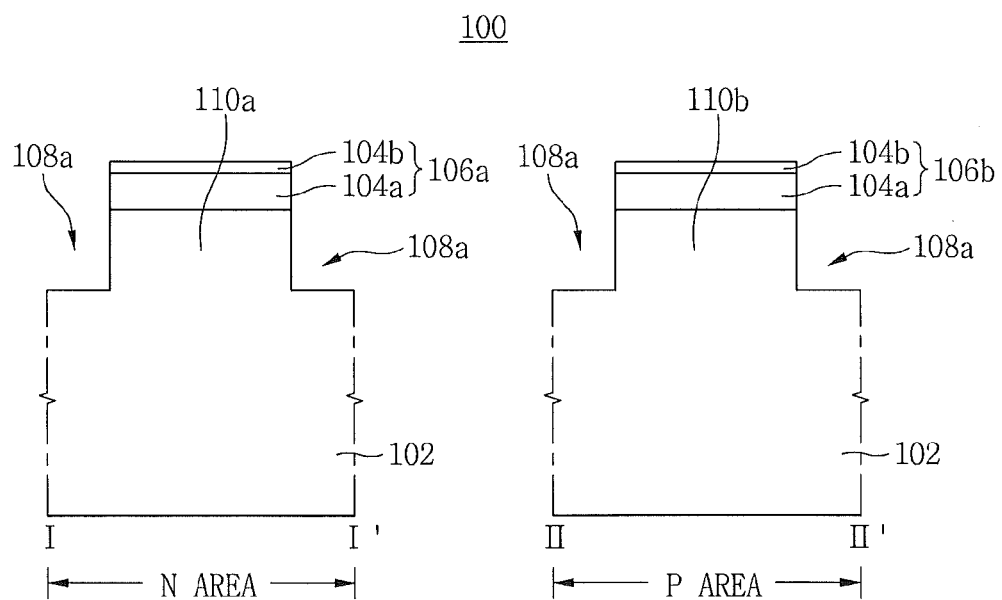
Figure 4B:
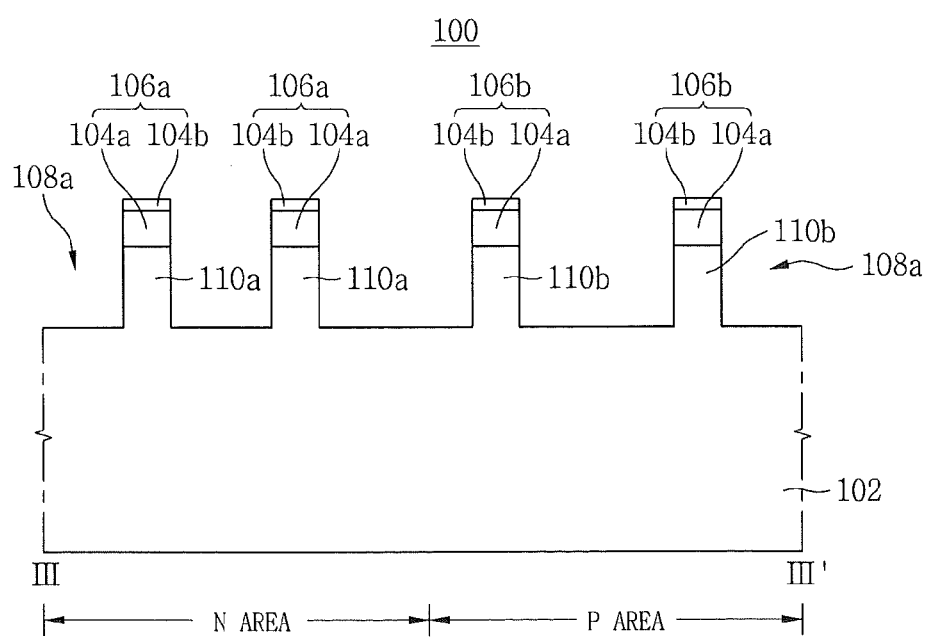

Referring to FIGS. 4A and 4B, the method may further include forming first trenches 108a in the substrate 102. The first trenches 108a may be formed by recessing a surface of the substrate 102 exposed between the first and second hard mask patterns 106a and 106b by a predetermined depth.

By the first trenches 108a, first active fins 110a may be formed under the first hard mask patterns 106a and second active fins 110b may be formed under the second hard mask patterns 106b. The first active fins 110a and the second active fins 110b may have relatively protruding shapes by the recessed first trenches 108a.

Figure 5A:
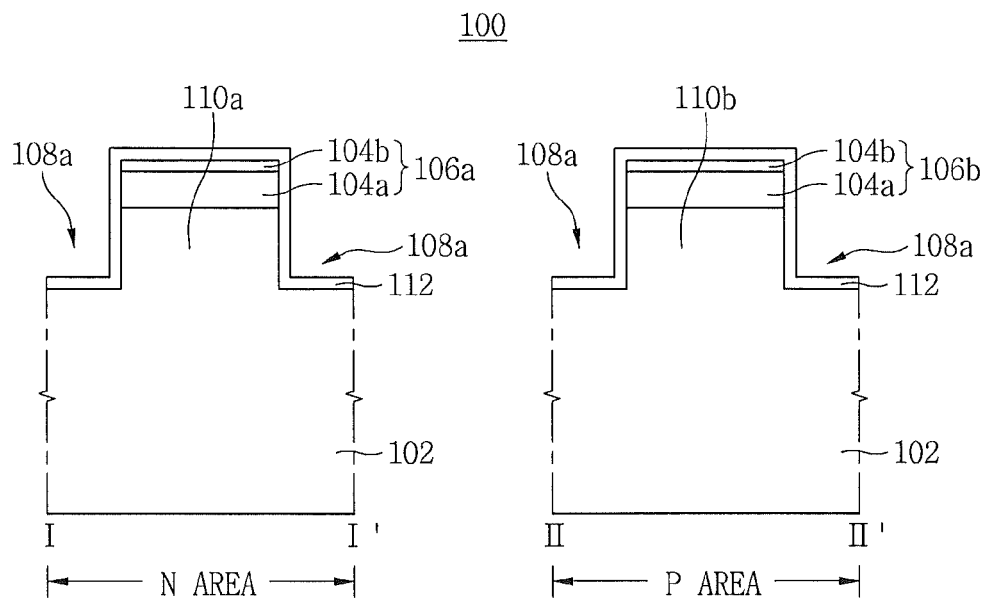
Figure 5B:
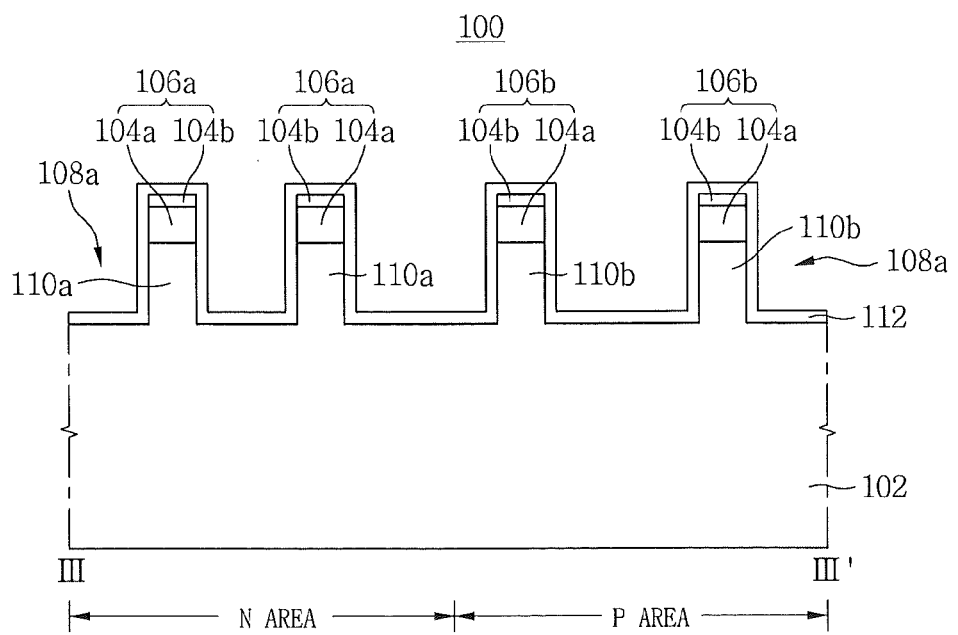

Referring to FIGS. 5A and 5B, the method may further include forming a spacer layer 112 on the entire substrate 102. The spacer layer 112 may cover side surfaces of the first and second active fins 110a and 110b, bottom surfaces of the first trenches 108a, the first hard mask patterns 106a, and the second hard mask patterns 106b. The spacer layer 112 may include silicon nitride ($SiN_x$). The process of forming the spacer layer 112 may include a CVD process.

Figure 6A:
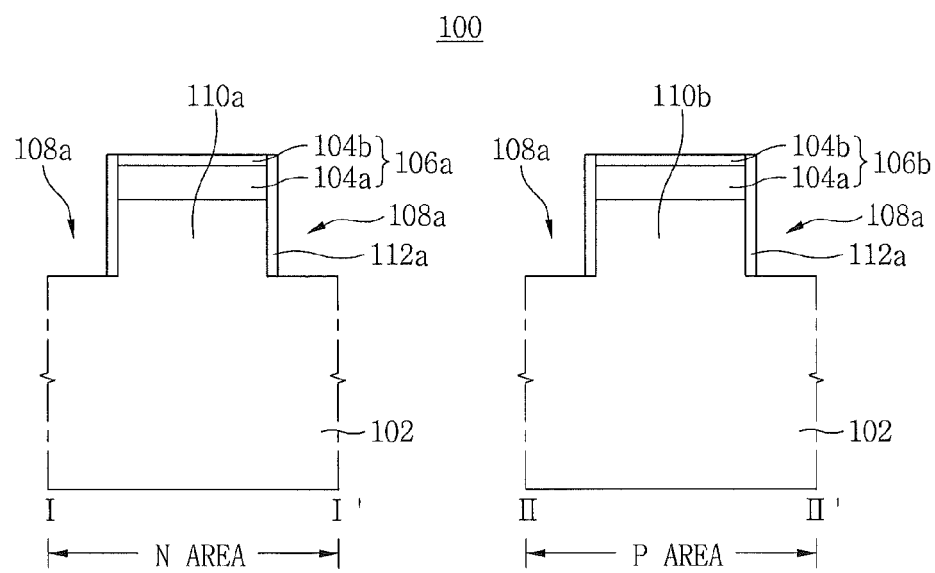
Figure 6B:
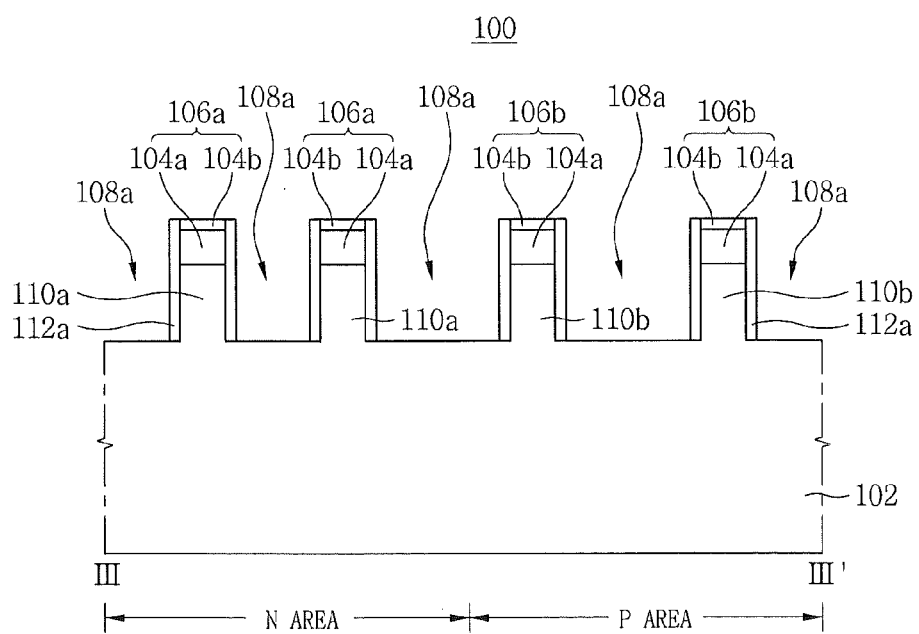

Referring to FIGS. 6A and 6B, the method may further include forming spacers 112a covering the side surfaces of the first and second active fins 110a and 110b. The formation of the spacers 112a may include etching the spacer layer 112 illustrated in FIGS. 5A and 5B. The process of etching the spacer layer 112 may include an etch-back process.

By the etch-back process, the silicon oxide patterns 104b of the first and second hard mask patterns 106a and 106b may be exposed, and the bottom surfaces of the first trenches 108a may be exposed.

Figure 7A:
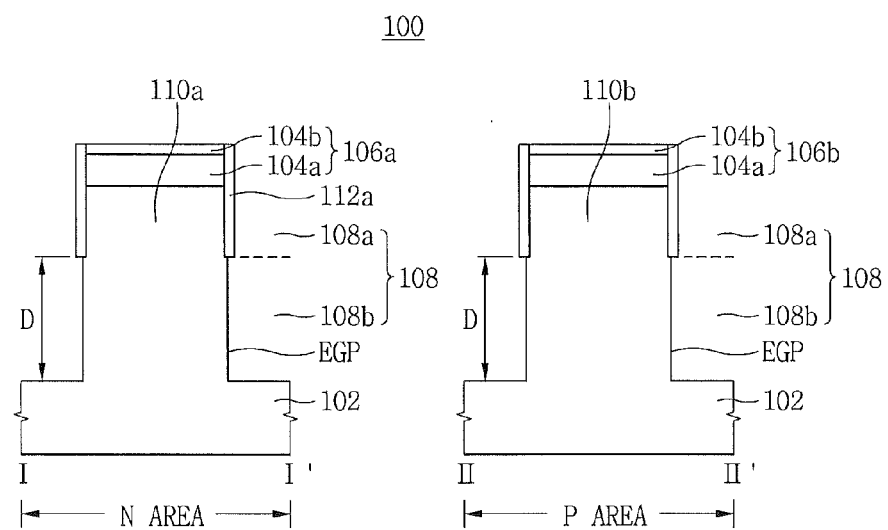
Figure 7B:
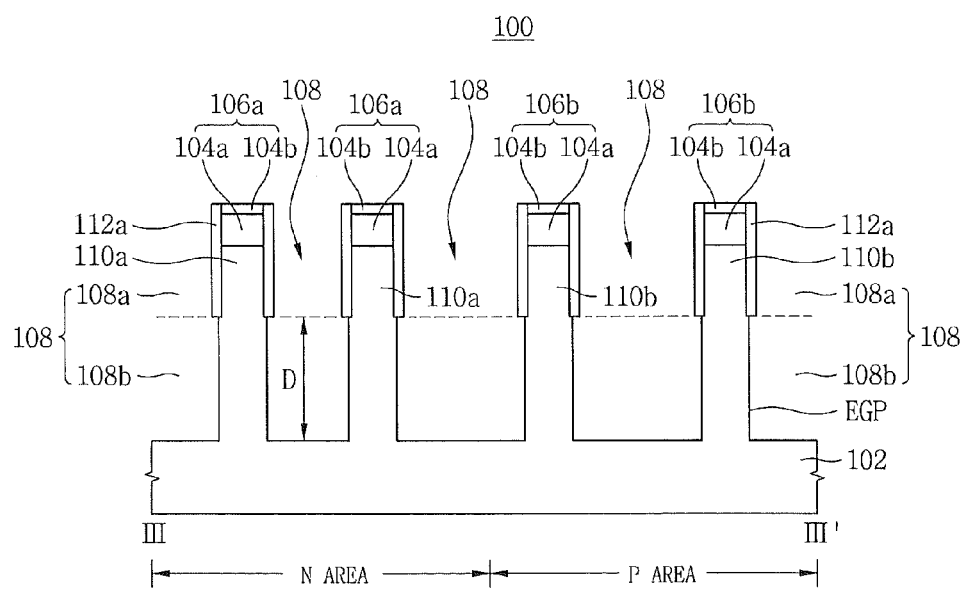

Referring to FIGS. 7A and 7B, the method may further include forming second trenches 108b under the first trenches 108a. The formation of the second trenches 108b may include recessing the bottom surfaces of the first trenches 108a illustrated in FIGS. 6A and 6B by a predetermined depth.

Extensions EGP of the first active fins 110a and second active fins 110b may be formed under the spacers 112a in a depth D etched for forming the second trenches 108b.

The first trench 108a and the second trench 108b may be merged to form a single trench 108. Sidewalls of the trenches 108 may include sidewalls of the first active fins 110a and the second active fins 110b.

Figure 8A:
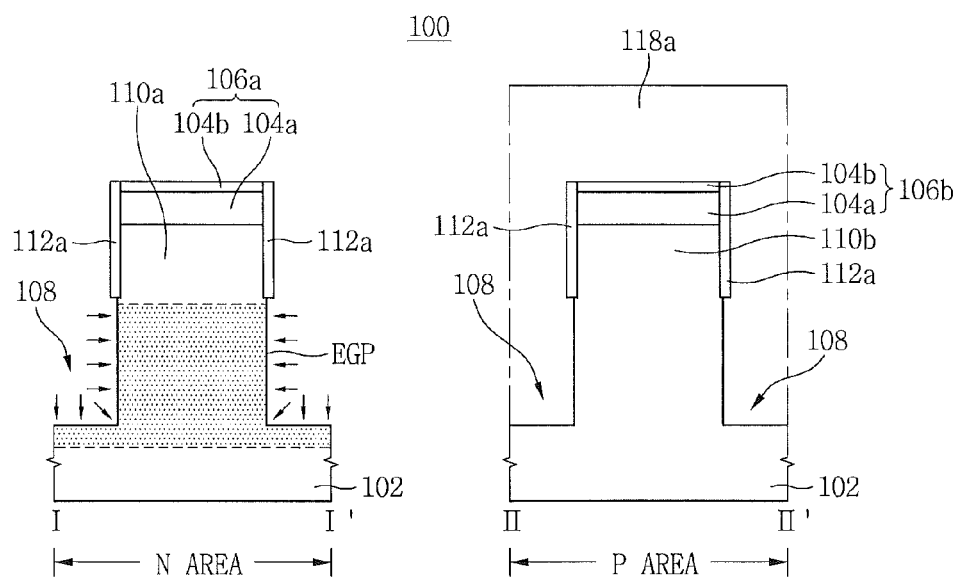
Figure 8B:
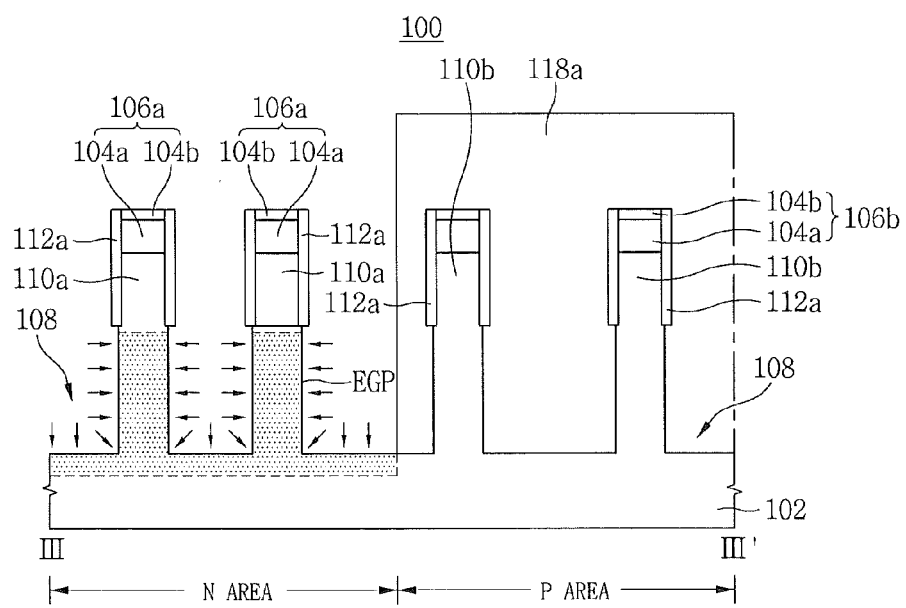

Referring to FIGS. 8A and 8B, the method may further include forming a first doping barrier layer 118a in the P-area, and implanting impurities in the N-area.

The implantation of the impurities may include implanting impurities in exposed side surfaces of the first active fins 110a, and bottom surfaces of the trenches 108.

The exposed side surfaces of the first active fins 110a may be side surfaces of the extensions EGP under the spacers 112a. Accordingly, a high concentration of impurities may be distributed in the extensions EGP of the first active fins 110a, and to a certain depth from the bottom surface of the trenches 108. Since a doping area is limited by the spacers 112a, the implanted impurities may be distributed in a high concentration in the extensions EGP of the first active fins 110a in which the spacers 112a are not formed.

The implantation of impurities may include a plasma ion-implantation process. The plasma ion-implantation process may include converting a source gas to a plasma state, and then implanting the ionized impurities by a DC bias voltage applied to the silicon substrate 102. Three-dimensional doping may be possible in the plasma ion-implantation process even at a low temperature and with low implantation energy. Accordingly, defects generated in surfaces and insides of the first active fins 110a may be reduced.

Here, the concentration of the implanted impurities may be within the range of from about $10^{17}$ to about $10^{20}/cm^3$.

The impurities implanted in the N-area may be p-type impurities, and the p-type impurities may include, for example, trivalent boron (B), indium (In), and gallium (Ga).

The first doping barrier layer 118a may include a photoresist. After the impurity implantation process, the first doping barrier layer 118a may be removed.

Figure 9A:
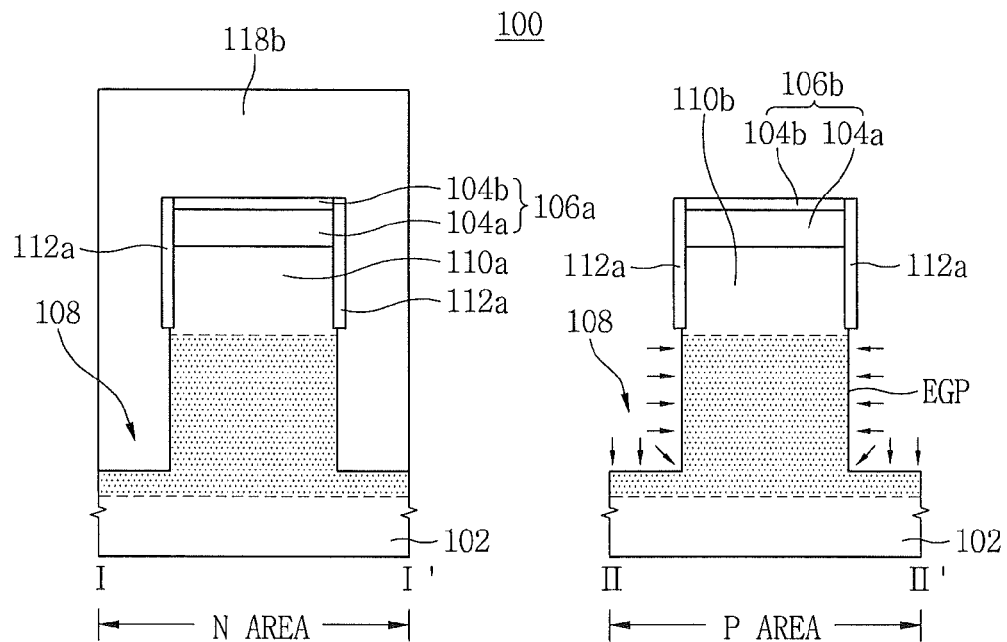
Figure 9B:
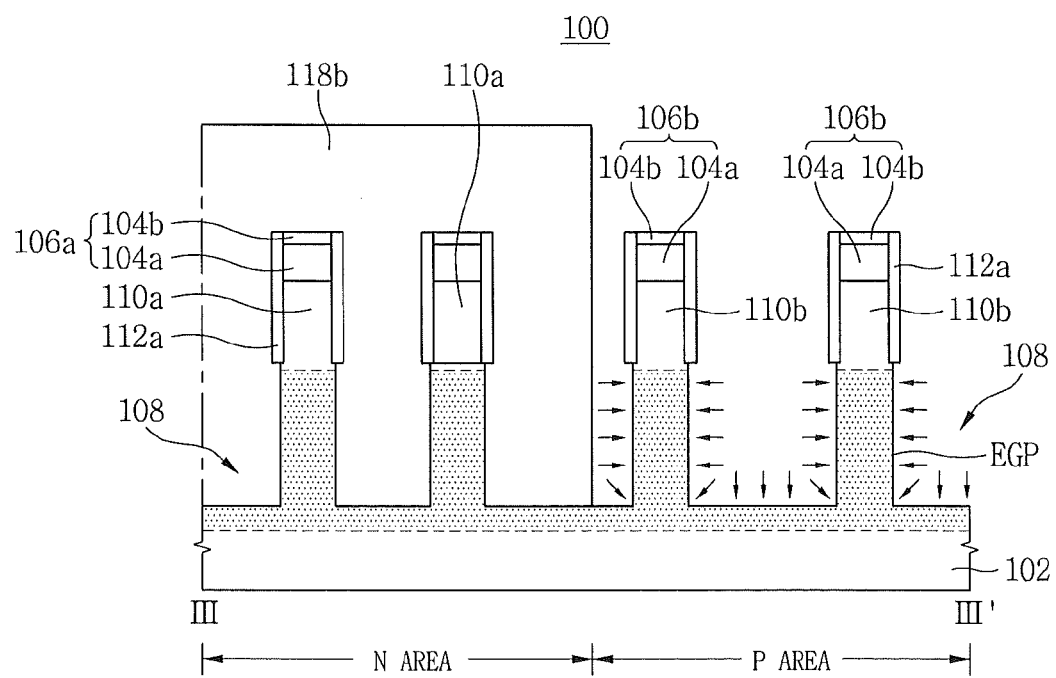

Referring to FIGS. 9A and 9B, a method of fabricating a semiconductor device in accordance with some embodiments of the inventive concept may include forming a second doping barrier layer 118b in the N-area, and implanting impurities in the P-area.

The implantation of the impurities may include implanting impurities in exposed side surfaces of the second active fins 110b, and bottom surfaces of the trenches 108.

The exposed side surfaces of the second active fins 110b may be side surfaces of the extensions EGP under the spacer 112a. Accordingly, impurities may be distributed in a high concentration in the extensions EGP of the second active fins 110b, and to a certain depth from the bottom surfaces of the trenches 108. Since a doping area is limited by the spacers 112a, the implanted impurities may be distributed in a high concentration in the extensions EGP of the second active fins 110b in which the spacers 112a are not formed.

In these embodiments, the concentration of the implanted impurities is within the range of from about $10^{17}$ to about $10^{20}/cm^3$. The implantation of the impurities may include a plasma ion-implantation process. The impurities implanted in the P-area may be n-type impurities, and the n-type impurities may include, for example, 5-valent phosphorus (P), arsenic (As), and antimony (Sb).

The second doping barrier layer 118b may include a photoresist. After the impurity implantation process, the second doping barrier layer 118b may be removed.

Figure 10A:
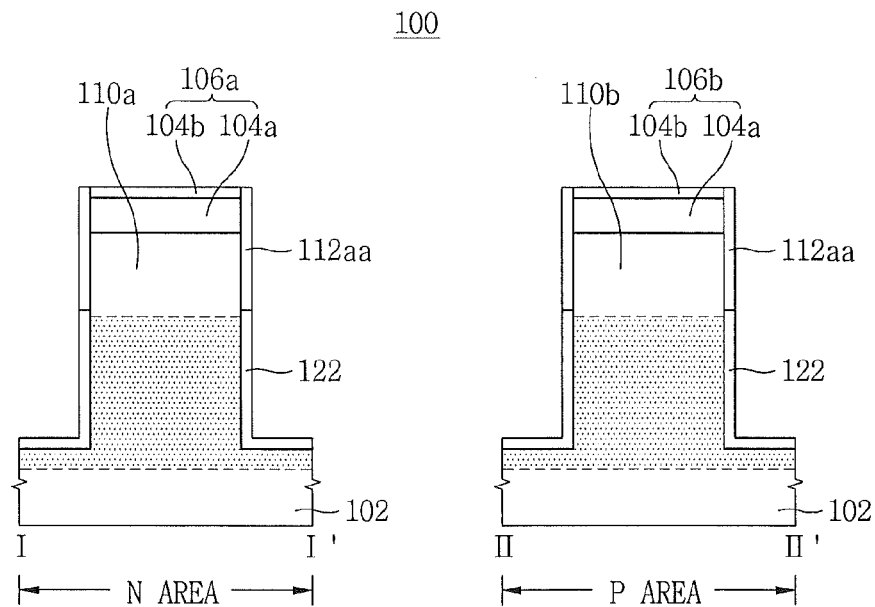
Figure 10B:
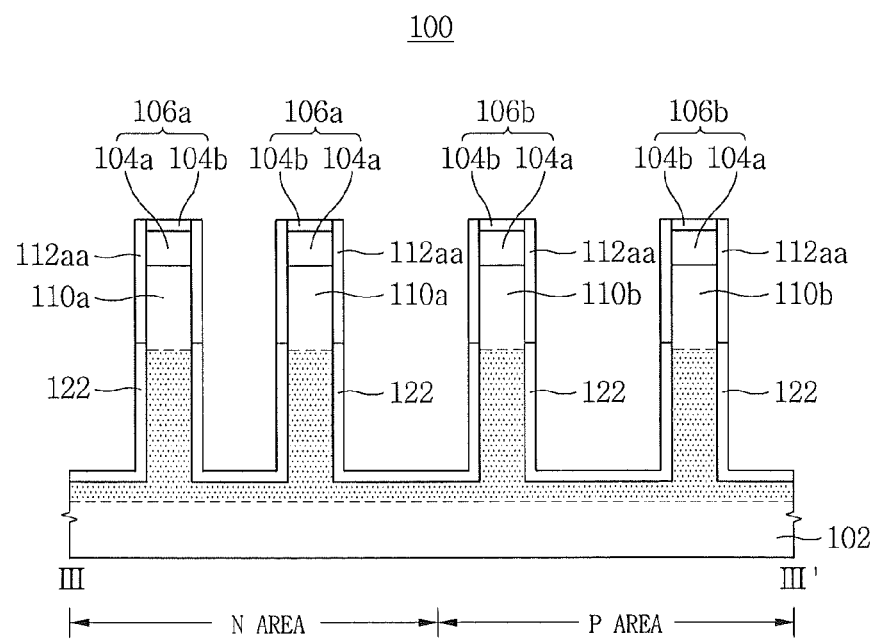

Referring to FIGS. 10A and 10B, the method may further include performing an annealing process on the substrate 102 of which the impurity implantation process has been completed. Furthermore, the method may further include performing an oxidation process with respect to the spacers 112a.

Silicon lattice damage generated while implanting the impurities in the silicon substrate 102 may be recovered by the annealing process. In these embodiments, the impurities may diffuse into upper parts of the first and second active fins 110a and 110b covered by the spacers 112a, however, the diffusion area may be controlled by controlling the annealing temperature. The annealing process may be performed at a temperature selected within the range of from about 400° C. to about 1000° C., depending on process conditions.

Through the oxidation process, the spacer 112a, which is a silicon nitride layer, may become a spacer oxide layer 112aa. During the oxidation process, the exposed side surfaces the first active fins 110a and second active fins 110b may be oxidized to form a trench oxide layer 122. The trench oxide layer 122 may expand from the side surfaces of the first active fins 110a and second active fins 110b to the insides and outsides of the side surfaces. The spacer oxide layer 112aa and the trench oxide layer 122 may include a silicon oxide layer.

Figure 11A:
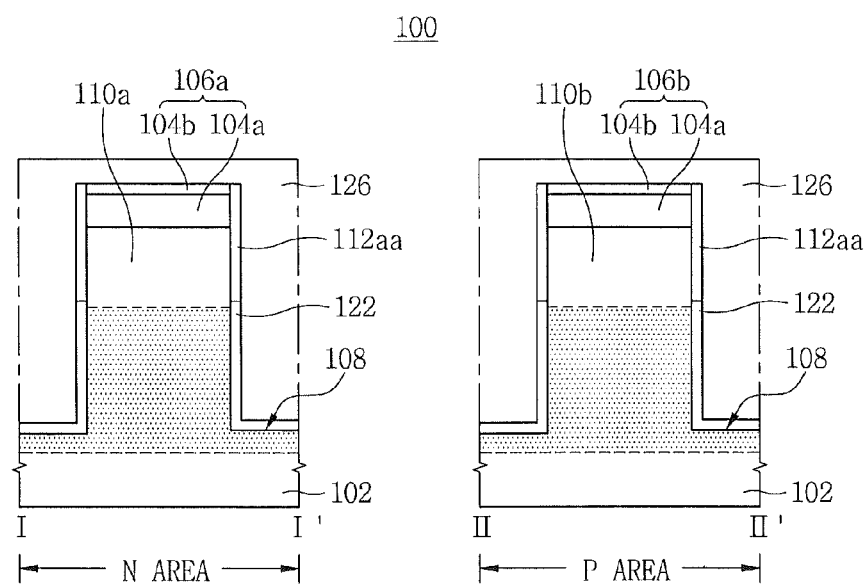
Figure 11B:
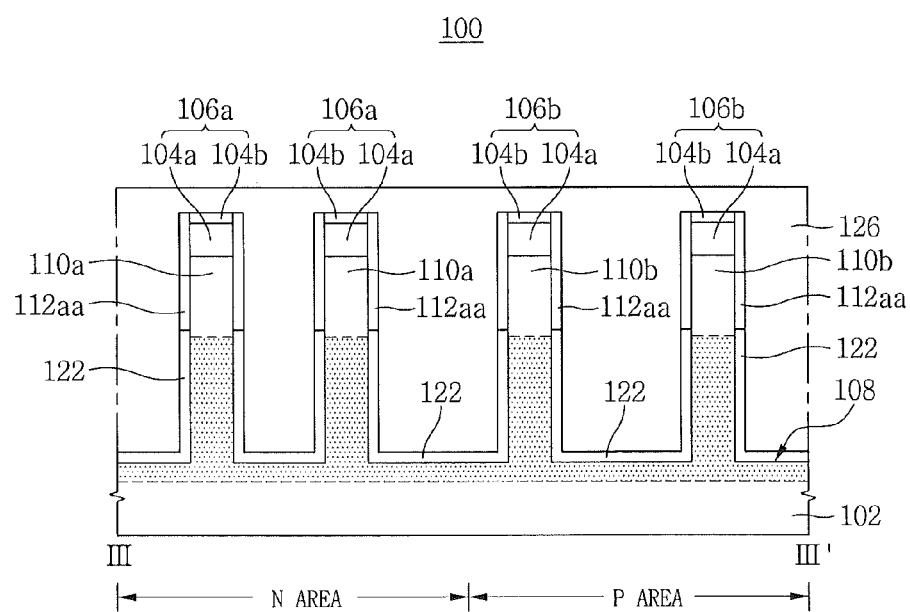

Referring to FIGS. 11A and 11B, the method may further include forming a gap-fill layer 126 filling the trenches 108, and covering the first hard mask pattern 106a, the second hard mask pattern 106b, the spacer oxide layer 112aa, and the trench oxide layer 122.

The gap-fill layer 126 may include silicon oxide. The formation of the gap-fill layer 126 may include a CVD process.

Figure 12A:
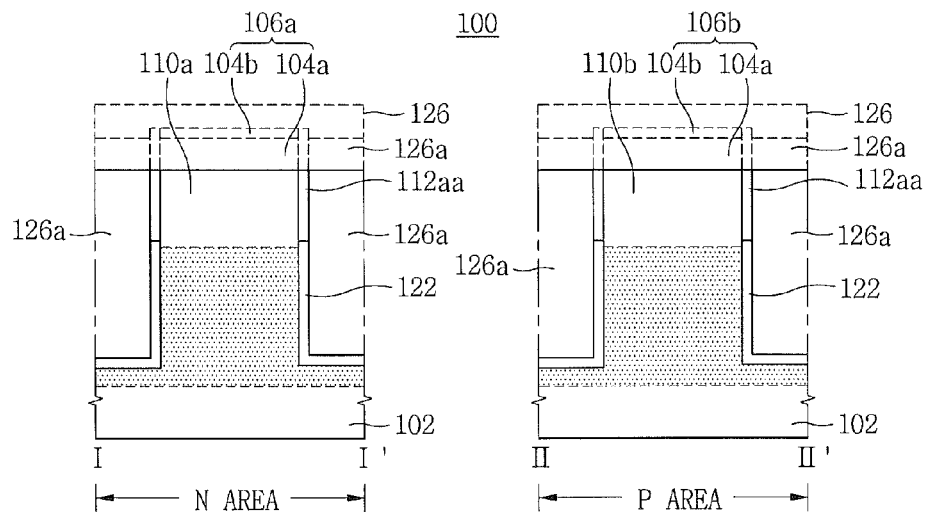
Figure 12B:
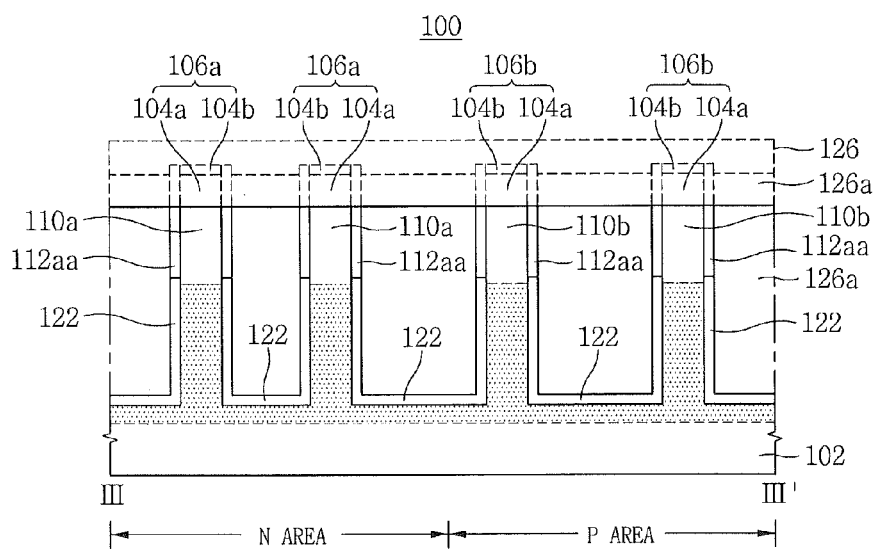

Referring to FIGS. 12A and 12B, the method may further include forming device isolation layers 126a filling the trenches 108. The formation of the device isolation layers 126a may include a planarization process and wet etching processes.

For example, the planarization process may include recessing the gap-fill layer 126 illustrated in FIGS. 11A and 11B until the silicon nitride patterns 104a of the first and second hard mask patterns 106a and 106b are exposed. At this time, the silicon oxide patterns 104b, which are the same material as the gap-fill layer 126, may be removed at the same time. In addition, surfaces of the device isolation layers 126a may be at the same level as surfaces of the silicon nitride patterns 104a.

The wet etching processes may include removing the silicon nitride patterns 104a to expose the surfaces of the first and second active fins 110a and 110b therebelow.

Furthermore, the wet etching processes may further include recessing the device isolation layers 126a and the spacer oxide layer 112aa, in such a way that the exposed surfaces of the second active fins 110b, device isolation layers 126a, and spacer oxide layer 112aa are at the same level.

Figure 13A:
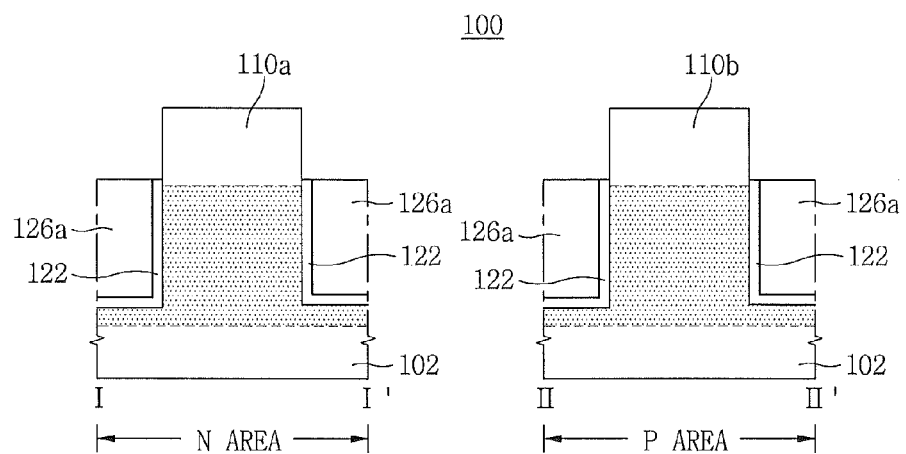
Figure 13B:
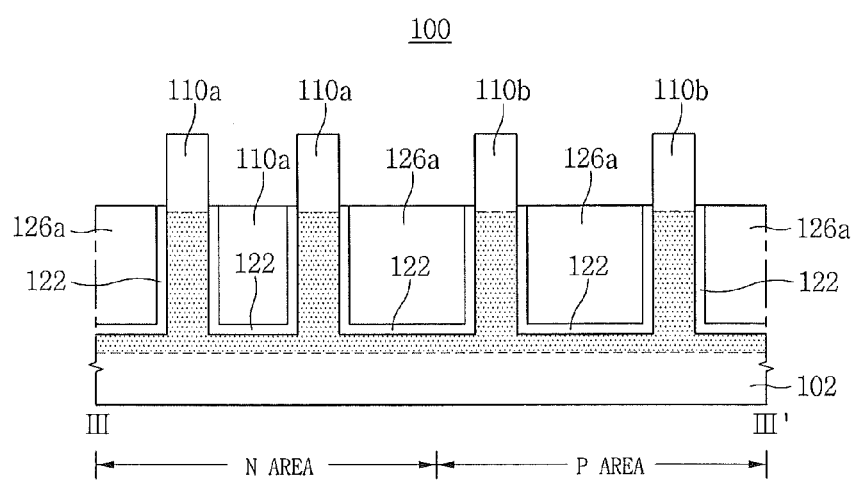

Referring to FIGS. 13A and 13B, the method may further include exposing upper parts of the first active fins 110a and second active fins 110b. The exposure of the first active fins 110a and the second active fins 110b may include recessing the device isolation layers 126a and the spacer oxide layer 112aa illustrated in FIGS. 12A and 12B by a predetermined depth from the surfaces. At this time, the spacer oxide layer 112aa may be fully removed. Accordingly, the surfaces of the recessed device isolation layers 126a and trench oxide layers 122 may be located at the same level.

Next, as shown in FIGS. 2A and 2B, the method may include forming a gate dielectric layer 123, a gate electrode 124, a gate capping layer 126, and a sidewall spacer 128. Next, impurity implantation processes for forming a source area and a drain area may be performed.

A semiconductor device in accordance with some embodiments of the inventive concept may be fabricated by the above-described processes. In the above-described processes, the spacer 112a may function to control the high concentration of impurities to be implanted within the extensions of the first and second active fins 110a and 110b. In addition, the high concentration of impurities can be implanted in the first active fins 110a and the second active fins 110b even at a low temperature and with relatively low energy by the plasma ion-implantation process. Damage generated in surfaces and insides of the first active fins 110a and second active fins 110b may be reduced even though the high concentration of impurities are implanted.

FIGS. 14A to 17B are cross sections illustrating processing steps in the fabrication of semiconductor devices in accordance with some embodiments of the present inventive concept in a process order, wherein FIGS. 14A to 17A are taken along lines I-I' and II-II' of FIG. 1, respectively, and FIGS. 14B to 17B are taken along line III-III' of FIG. 1.

Figure 14A:
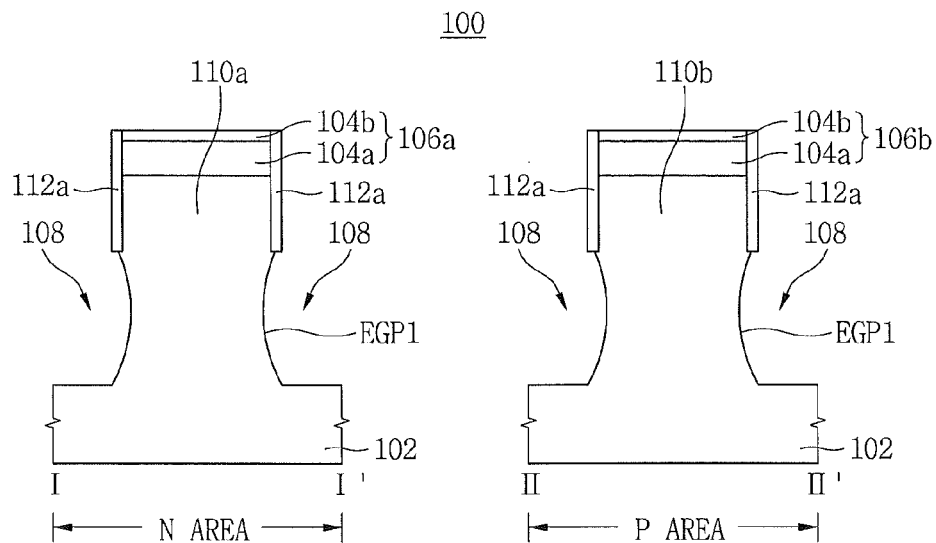
Figure 14B:
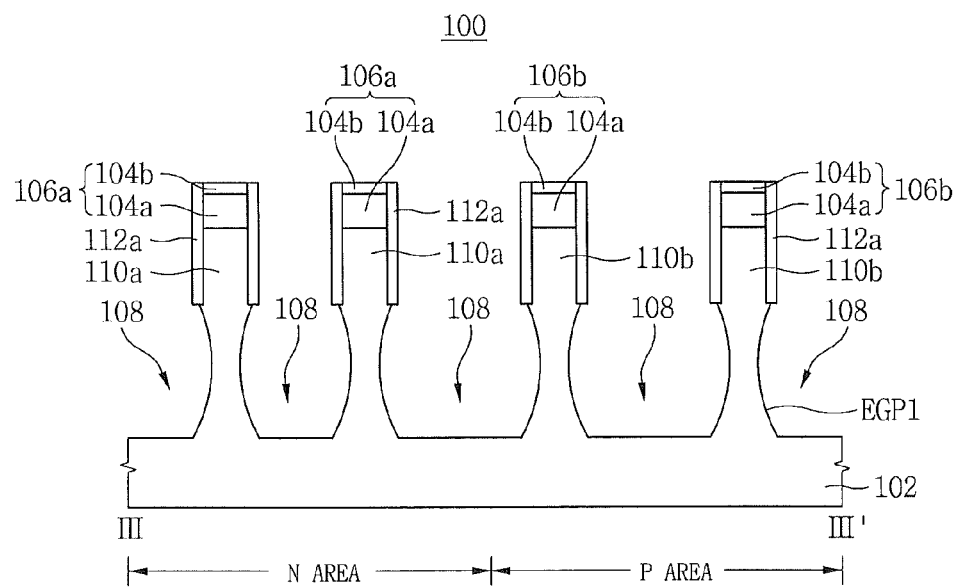

Details discussed above with respect to FIGS. 3A to 7A and FIGS. 3B to 7B are similar to those in embodiments illustrated in FIGS. 14A-17B and, therefore, will not be discussed further herein in the interest of brevity. Referring to FIGS. 14A and 14B, in some embodiments, methods may include side-etching side surfaces of extensions EGP1 of first and second active fins 110a and 110b to have a concave shape.

The etched side surfaces of the first and second active fins 110a and 110b may be side surfaces exposed under spacers 112a, and sidewalls of trenches 108. In these embodiments, the spacers 112a may be used as a etch mask.

The etched side surfaces of extensions EGP1 of the first and second active fins 110a and 110b may be recessed toward the central axis of the first and second active fins 110a and 110b. Accordingly, widths of the extensions EGP1 of the first and second active fins 110a and 110b may become narrow from below the spacer 112a at a certain rate and become wide again.

The etching process may include a wet etching process, and the etchant used in the wet-etching process may include, for example, an SC1 solution. The SC1 solution is a solution in which $NH_4OH$, $H_2O_2$, and $H_2O$ are mixed in a proper ratio. $H_2O_2$ of the SC1 may participate in an oxidation reaction, and $NH_4OH$ may serve to anisotropically etch the silicon substrate 102. Accordingly, in order to obtain a proper form of side-etching, a solution in which the two components are mixed in an optimal concentration ratio may be used.

Figure 15A:
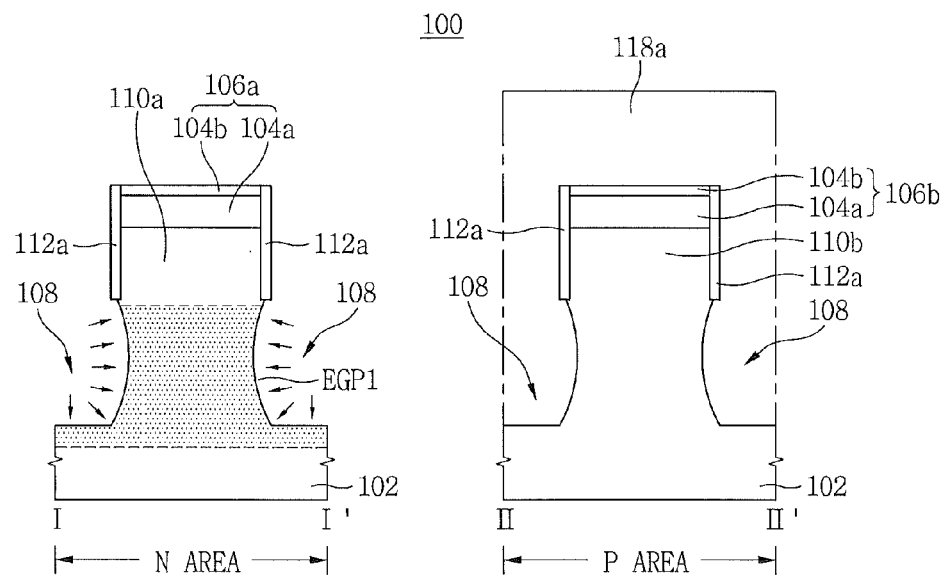
Figure 15B:
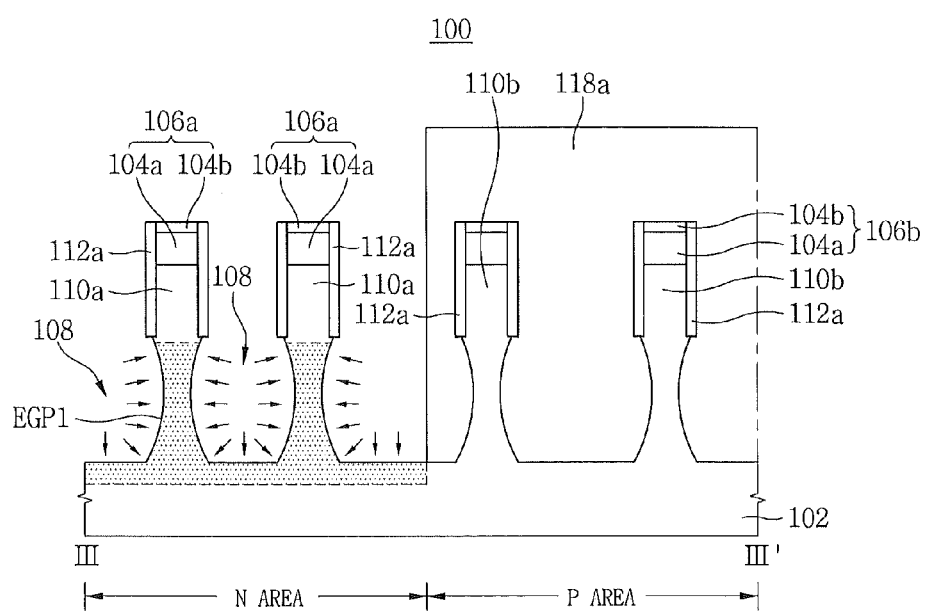

Referring to FIGS. 15A and 15B, the method may further include forming a first doping barrier layer 118a in a P-area, and implanting doping impurities in exposed side surfaces of the first active fins 110a in an N-area.

The exposed side surfaces of the first active fins 110a may be side surfaces of the extensions EGP1 of the first active fins 110a, and have the aforementioned concave shape.

The impurity implantation process may include a plasma ion-implantation process. The plasma ion-implantation may achieve three-dimensional doping, and thereby impurities may be implanted in the extensions EGP1 of the first active fins 110a, and bottom surfaces of the trenches 108.

The implanted impurities may be distributed in a high concentration in the extensions EGP1 of the first active fins 110a, and from the bottom surfaces of the trenches 108 to a certain depth. Since the doping area is limited by the spacer 112a, the implanted impurities may be distributed in a high concentration in the extensions EGP1 of the first active fins 110a in which the spacers 112a are not formed. In some embodiments, the first doping barrier layer 118a may include a photoresist. The impurities implanted in the N-area may be p-type impurities, and the p-type impurities may include trivalent boron (B), indium (In), or gallium (Ga). The first doping barrier layer 118a may be removed after the impurity implantation process.

Figure 16A:
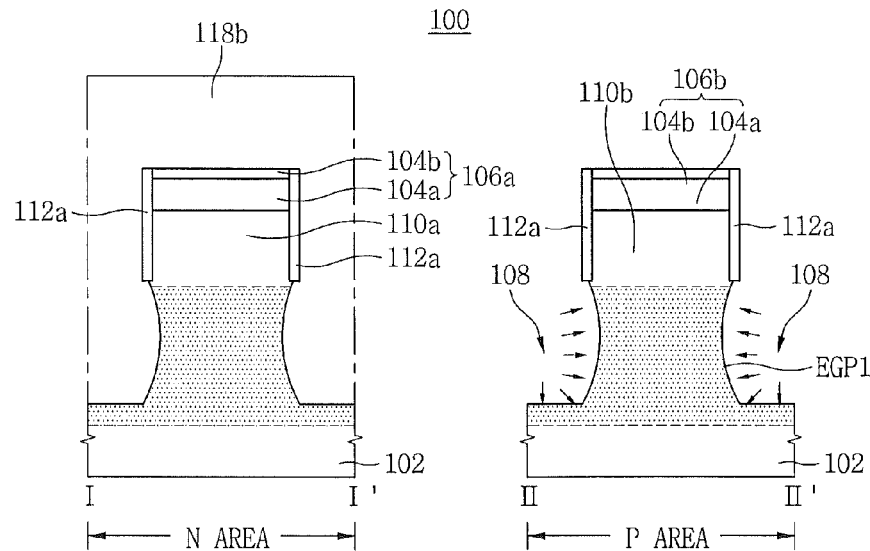
Figure 16B:
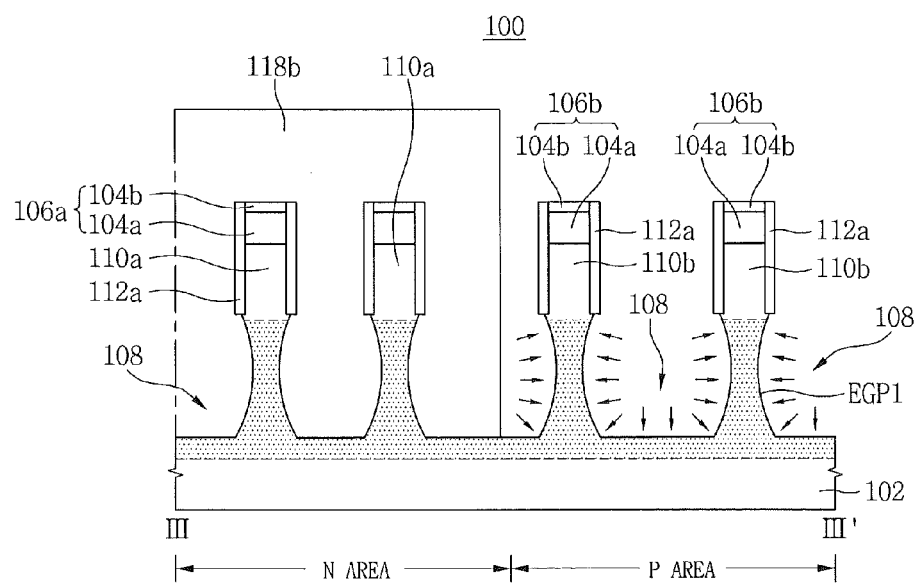

Referring to FIGS. 16A and 16B, a second doping barrier layer 118b covering the N-area may be formed, and doping impurities may be implanted in exposed side surfaces of the second active fins 110 formed in the P-area. The exposed side surfaces of the second active fins 110b may be side surfaces of the extensions EGP1 of the second active fins 110b, and have the aforementioned concave form.

The impurity implantation process may include a plasma ion-implantation process. The plasma ion-implantation may achieve three-dimensional doping, and thereby impurities may be implanted through inner walls of the trench 108, in particular, side surfaces of the second active fins 110b, and bottom surfaces of the trenches 108.

The implanted impurities may be distributed in a high concentration in the extensions EGP1 of the second active fins 110b, and to a certain depth from the bottom surfaces of the trenches 108. Since the doping area is limited by the spacers 112a, the implanted impurities may be distributed in a high concentration in the extensions EGP1 of the second active fins 110b in which the spacers 112a are not formed. In some embodiments, the second doping barrier layer 118b may include a photoresist.

The impurities implanted in the P-area may be n-type impurities, and the n-type impurities may include 5-valent phosphorus (P), arsenic (As), or antimony (Sb). The second doping barrier layer 118b may be removed after the impurity implantation process.

Figure 17A:
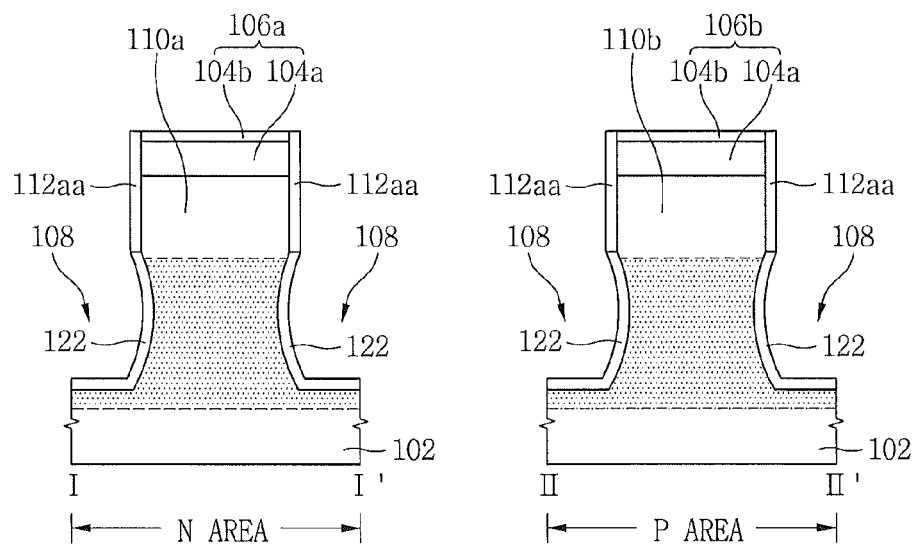
Figure 17B:
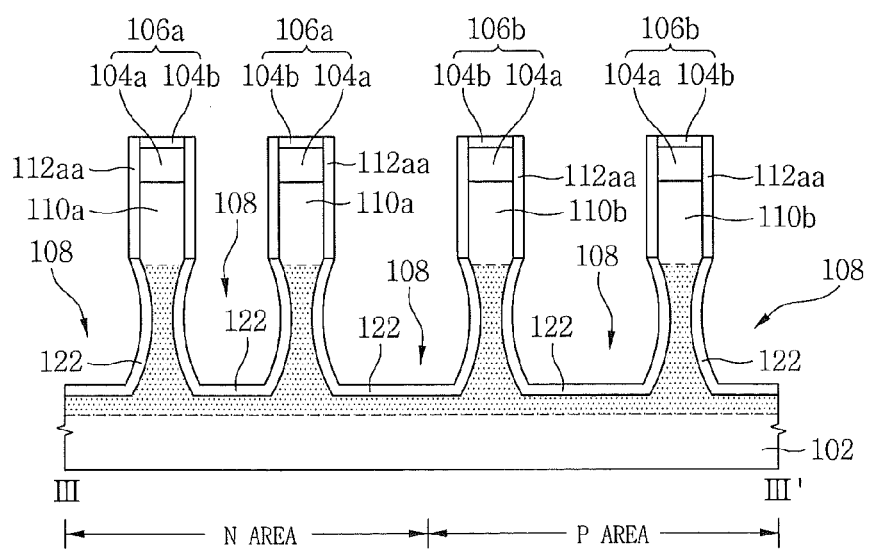

Referring to FIGS. 17A and 17B, an annealing process may be performed on the substrate 102 in which the impurity implantation process is completed. In some embodiments, an oxidation process may be performed on the spacer 112a discussed with respect to FIGS. 16A and 16B.

Silicon lattice damage generated while impurities are implanted in the silicon substrate 102 may be recovered by the annealing process. Although the impurities are diffused into upper areas of the active fins 110a and 110b covered by the spacers 112a, the diffusion area may be controlled by controlling the annealing temperature. The annealing process may be performed at a temperature selected within the range of from about 400° C. to 1000° C. depending on process conditions.

The spacer 112a may be changed from a silicon nitride layer to a spacer oxide layer 112aa by the oxidation process. During the oxidation process, the exposed side surfaces of the first active fins 110a and second active fins 110b may also be oxidized to form trench oxide layers 122. The trench oxide layers 122 may expand from the side surfaces of the first active fins 110a and second active fins 110b to the insides and outsides of the side surfaces.

The spacer oxide layer 112aa and the trench oxide layer 122 may include a silicon oxide layer. The oxidation process may include a thermal oxidation process.

Since the remaining processes are similar as those discussed above with reference to FIGS. 11A to 13A, and FIGS. 11B to 13B, detailed descriptions thereof will not be discussed further herein in the interest of brevity.

Semiconductor device in accordance with some embodiments of the inventive concept will be fabricated by performing the above-described processes. In the aforementioned processes, a high concentration of impurities can be implanted in a short amount of time by reducing the width of the extensions of the active fins 110a and 110b in which impurities are implanted.

FIGS. 18A to 26B are cross sections illustrating processing steps in the fabrication of semiconductor devices in accordance with some embodiments of the inventive concept in a process order, wherein FIGS. 18A to 26A are taken along lines I-I' and II-II' of FIG. 1, respectively, and FIGS. 18B to 26B are taken along line III-III' of FIG. 1.

Processing steps discussed hereinafter will include the processes of implanting impurities in active fins using an impurity-implantation layer. Since processes and configurations formed by the processes are similar to those discussed above with reference to FIGS. 3A to 7A, and FIGS. 3B to 7B until the process of forming trenches 108, detailed descriptions thereof will be omitted.

Figure 18A:
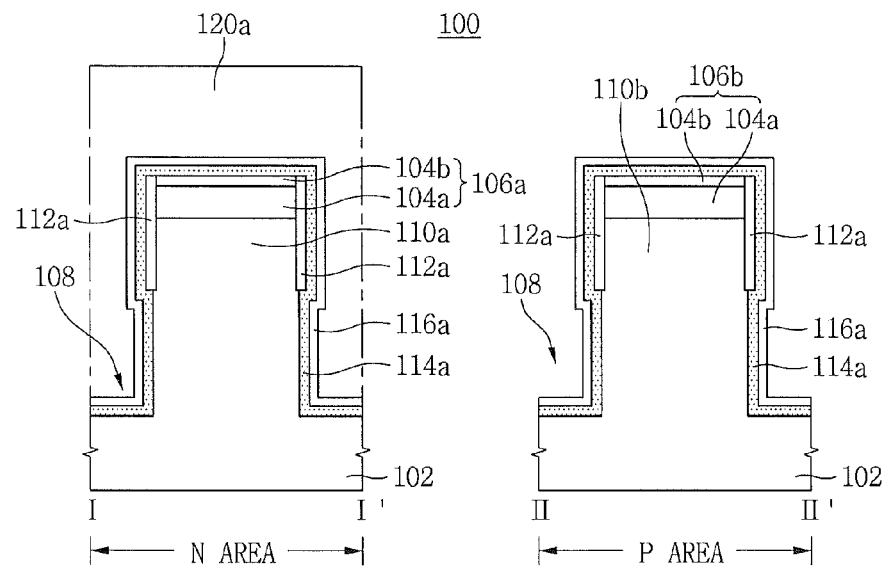
Figure 18B:
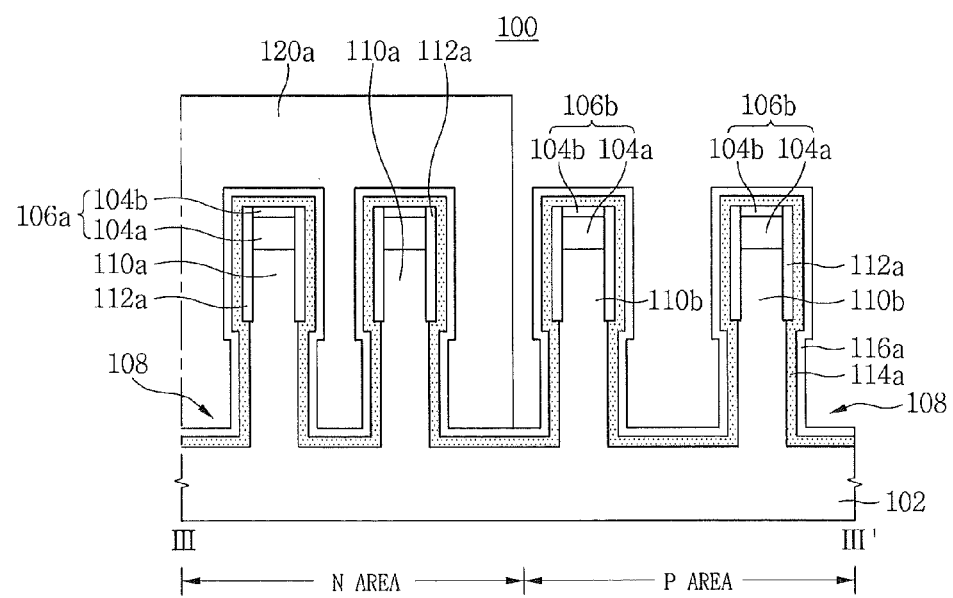

Referring to FIGS. 18A and 18B, a first impurity-implantation layer 114a and a first diffusion barrier layer 116a may be conformally formed on the entire substrate 102. In some embodiments, a first etch stopping layer 120a may be formed to cover the first diffusion barrier layer 116a in the N-area.

In particular, the first impurity-implantation layer 114a may cover first active fins 110a, second active fins 110b, spacers 112a, and exposed surfaces of the trenches 108. The first diffusion barrier layer 116a may cover a surface of the first impurity-implantation layer 114a.

The first impurity-implantation layer 114a may include impurities implanted in the first active fins 110a. The first diffusion barrier layer 116a may protect the first impurity-implantation layer 114a, and reduce, or possibly prevent, out-diffusing of impurities of the first impurity-implantation layer 114a while forming the first etch stopping layer 120a.

The first impurity-implantation layer 114a may include, for example, a BSG layer containing boron. The first diffusion barrier layer 116a may include a silicon oxide layer. The first etch stopping layer 120a may include a photoresist film.

The formation of the first impurity-implantation layer 114a may include an ALD process, and the formation of the first diffusion barrier layer 116a may include an in-situ oxidation process.

Figure 19A:
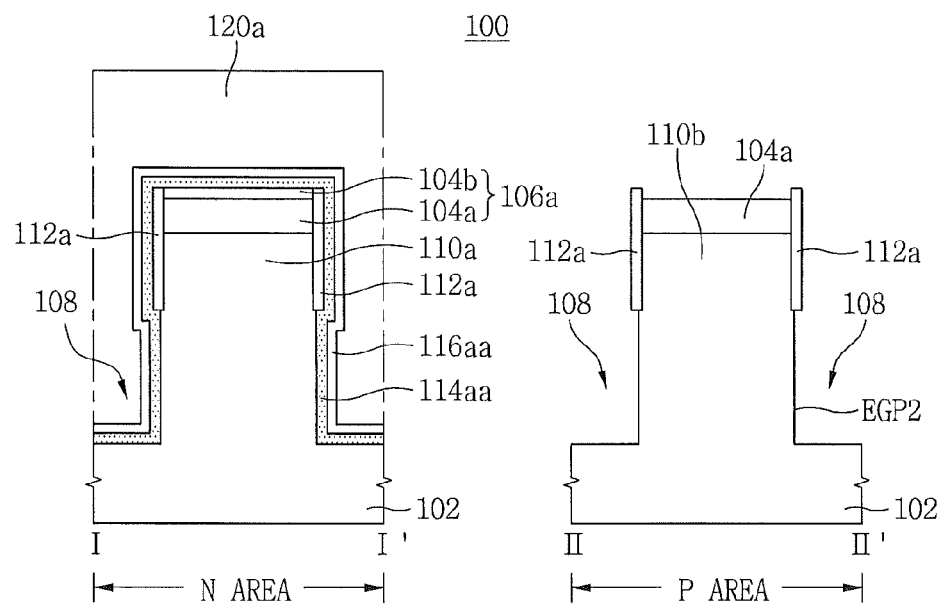
Figure 19B:
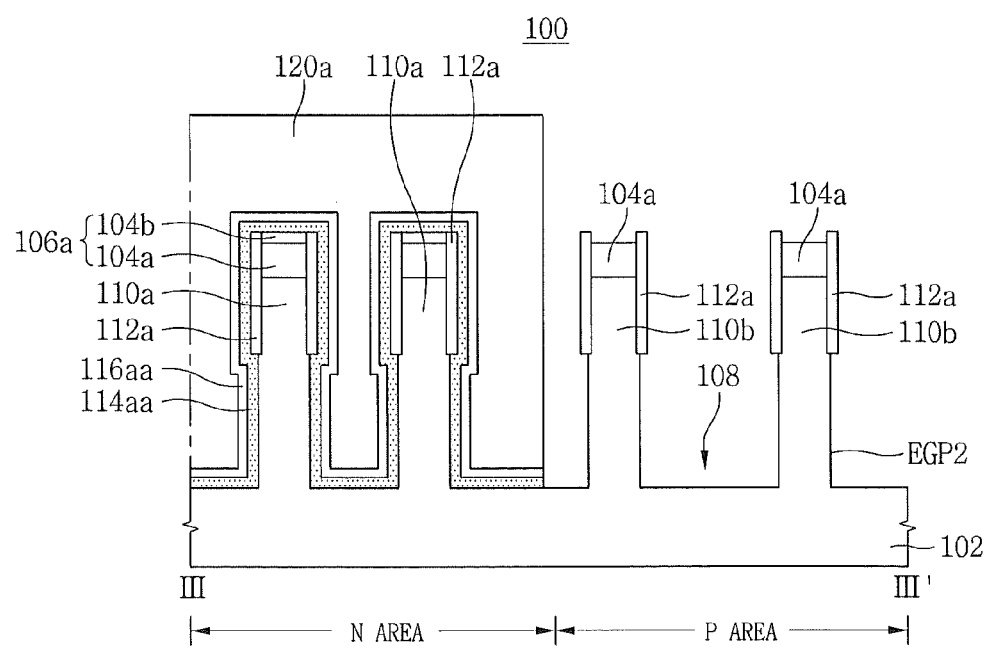

Referring to FIGS. 19A and 19B, the first impurity-implantation layer 114a and the first diffusion barrier layer 116a in the P-area discussed above with respect FIGS. 18A and 18B may be removed. In the P-area, extensions EGP2 of the second active fins 110b, bottom surfaces of the trenches 108, and upper surfaces of the silicon nitride patterns 104a may be exposed. Silicon oxide patterns 104b of second hard mask patterns 106b described in FIGS. 18A and 18B may be removed together with the first impurity-implantation layer 114a and first diffusion barrier layer 116a. A first impurity-implantation layer pattern 114aa and a first diffusion barrier layer pattern 116aa may be located under the first etch stopping layer 120a in the N-area.

Figure 20A:
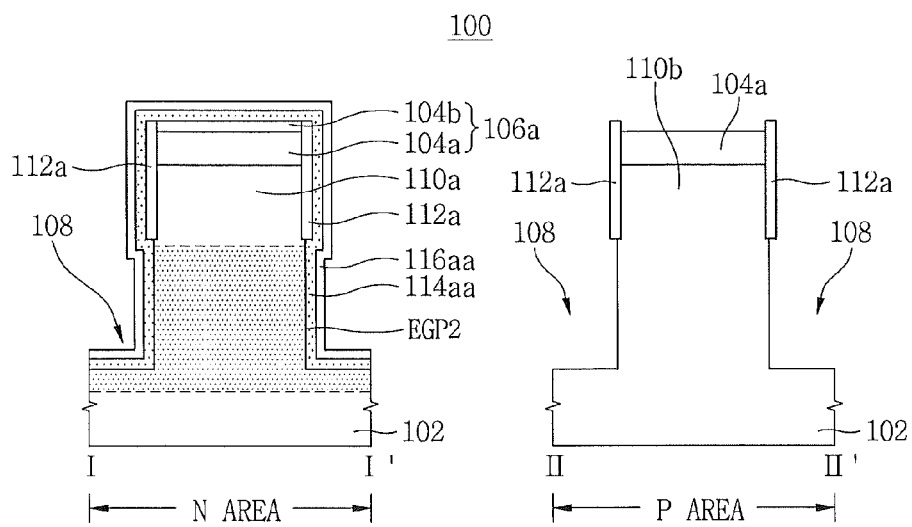
Figure 20B:
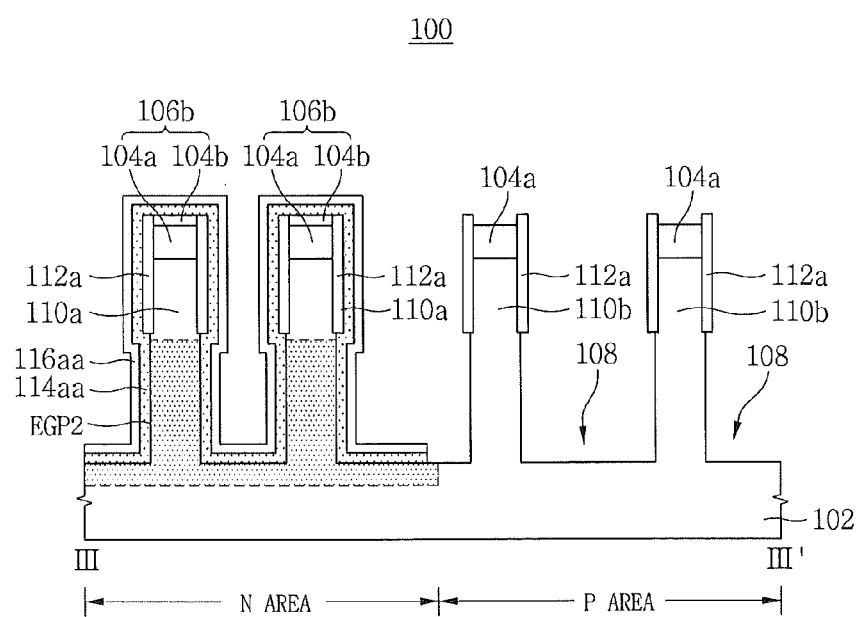

Referring to FIGS. 20A and 20B, impurities may be implanted in the extensions EGP2 of the first active fins 110a. The impurity implantation process may include diffusing boron contained in the first impurity-implantation layer pattern 114aa to the extensions EGP2 of the first active fins 110a and bottom surfaces of the trenches 108. In these embodiments, the substrate 102 may be heated to a high temperature of from about 600° C. to about 1000° C. By the heat of high temperature applied to the substrate 102, boron contained in the first impurity-implantation layer pattern 114aa may be diffused into the first active fins 110a, and to a certain depth below the bottom surfaces of the trenches 108.

Since the doping area is limited by the spacers 112a, the implanted impurities may be distributed in a high concentration at the extensions EGP2 of the first active fins 110a in which the spacers 112a are not formed. In these embodiments, the concentration of the implanted impurities may be within the range of from about $10^{17}$ to about $10^{20}$/cm$^3$.

Figure 21A:
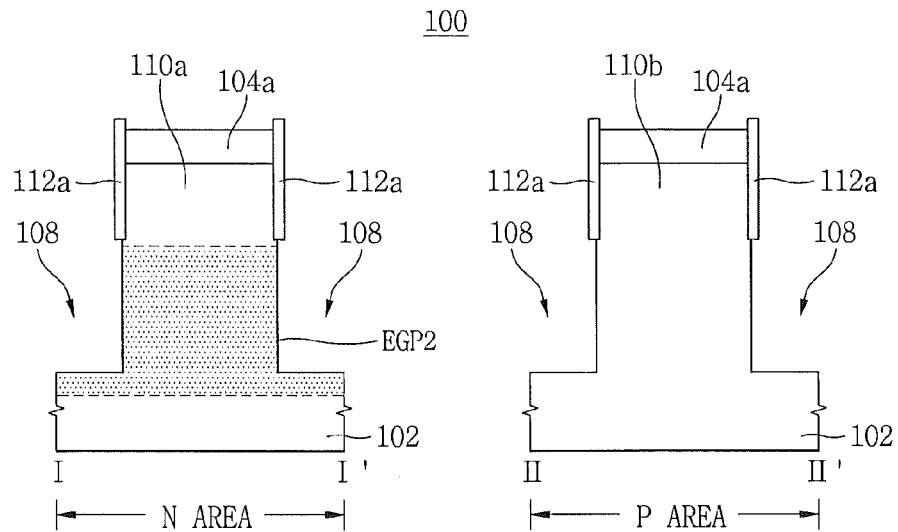
Figure 21B:
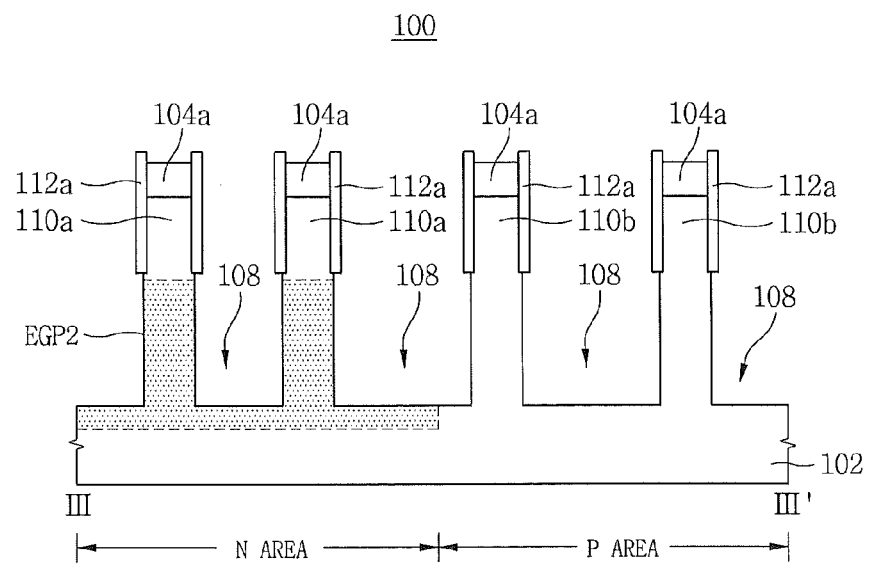

Referring to FIGS. 21A and 21B, the first impurity-implantation layer pattern 114aa and the first diffusion barrier layer pattern 116aa discussed above with respect to FIGS. 20A and 20B may be removed. In these embodiments, the silicon oxide patterns 104b of the first hard masks 106a in the N-area may be removed to expose silicon nitride patterns 104a therebelow.

Accordingly, the silicon nitride patterns 104a covering the first active fins 110a and the second active fins 110b may be exposed in both the N-area and P-area. Further, the extensions EGP2 of the first active fins 110a may be in a state in which high concentration of impurities (indicated by dots) may be implanted.

Figure 22A:
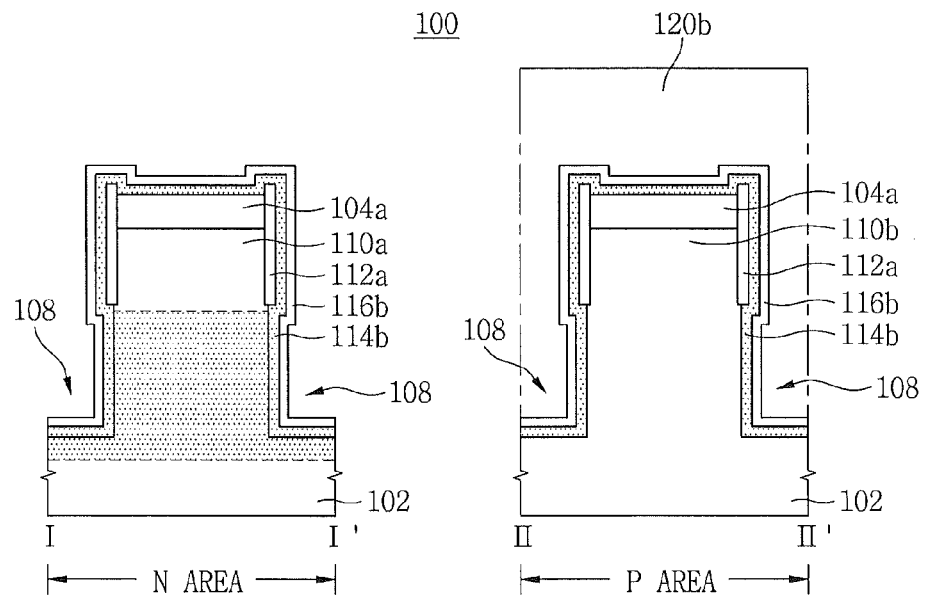
Figure 22B:
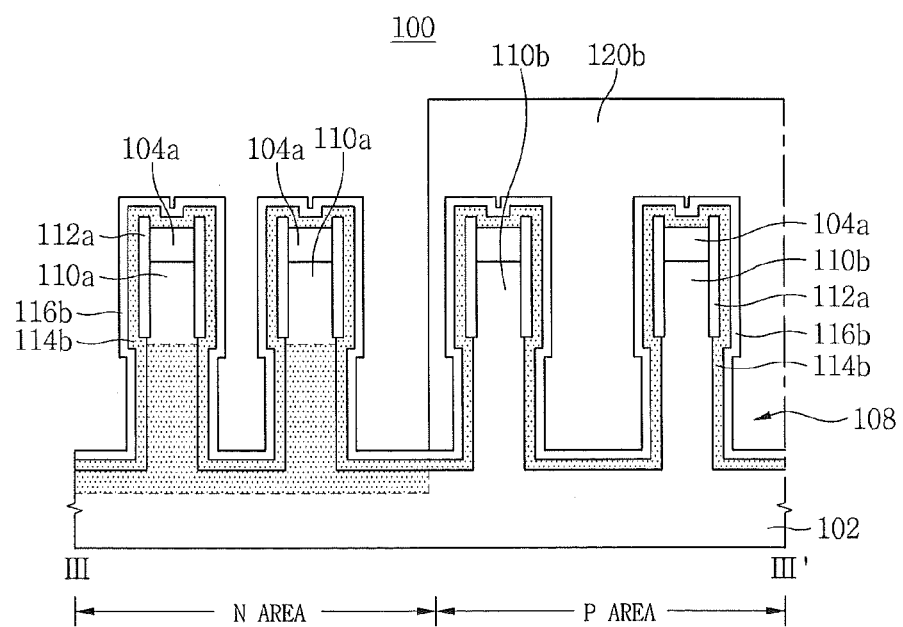

Referring to FIGS. 22A and 22B, a second impurity-implantation layer 114b and a second diffusion barrier layer 116b may be formed on the entire substrate 102 including the first active fins 110a and the second active fins 110b. In some embodiments, a second etch stopping layer 120b may be formed covering the P-area.

The second impurity-implantation layer 114b may be conformally formed along exposed surfaces of the second active fins 110b, the spacers 112a, and the trenches 108. The second diffusion barrier layer 116b may be formed on an upper surface of the second impurity-implantation layer 114b.

The second impurity-implantation layer 114b may include, for example, a PSG layer containing phosphorous. The second diffusion barrier layer 116b may include a silicon oxide layer. The second etch stopping layer 120b may include a photoresist layer.

The formation of the second impurity-implantation layer 114b may include an ALD process, and the formation of the second diffusion barrier layer 116b may include an in-situ oxidation process.

Figure 23A:
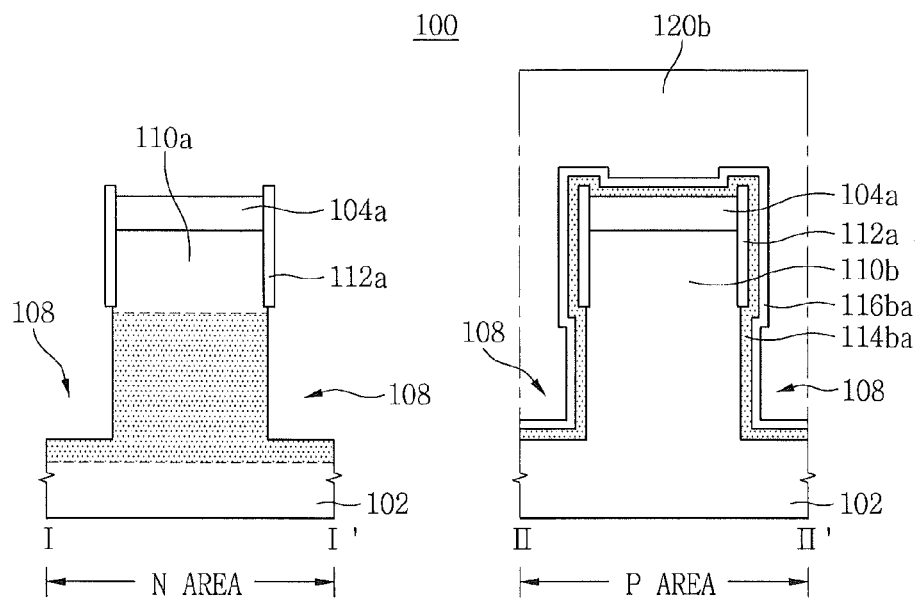
Figure 23B:
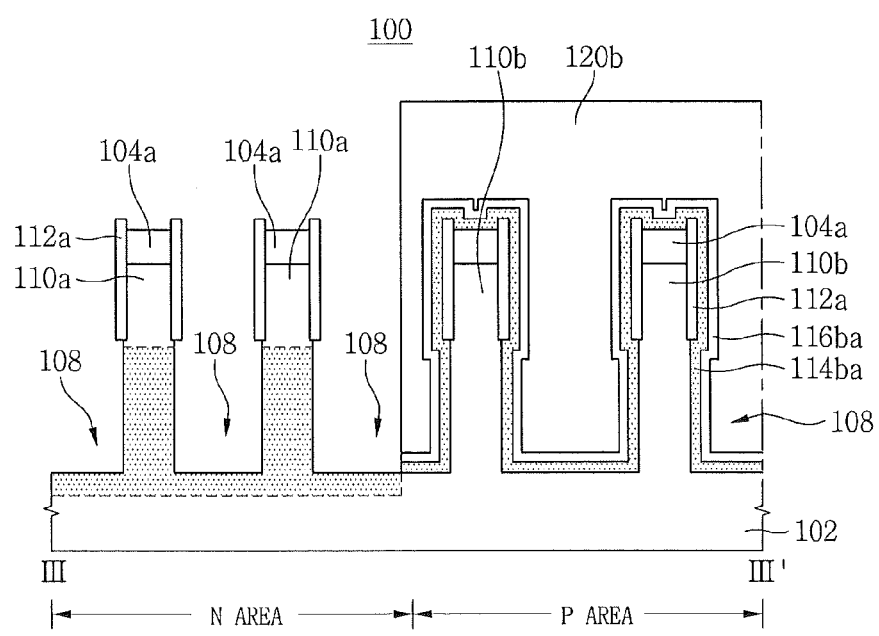

Referring to FIGS. 23A and 23B, the second impurity-implantation layer 114b and the second diffusion barrier layer 116b in the N-area discussed above with respect to FIGS. 22A and 22B may be removed.

In the N-area, the spacers 112a, the extensions EGP2 of the first active fins 110a, the upper surfaces of the silicon nitride patterns 104a, and the bottom surfaces of the trenches 108 may be exposed. A second impurity-implantation layer pattern 114ba and a second diffusion barrier layer pattern 116ba may be formed under the second etch stopping layer 120b of the P-area.

Figure 24A:
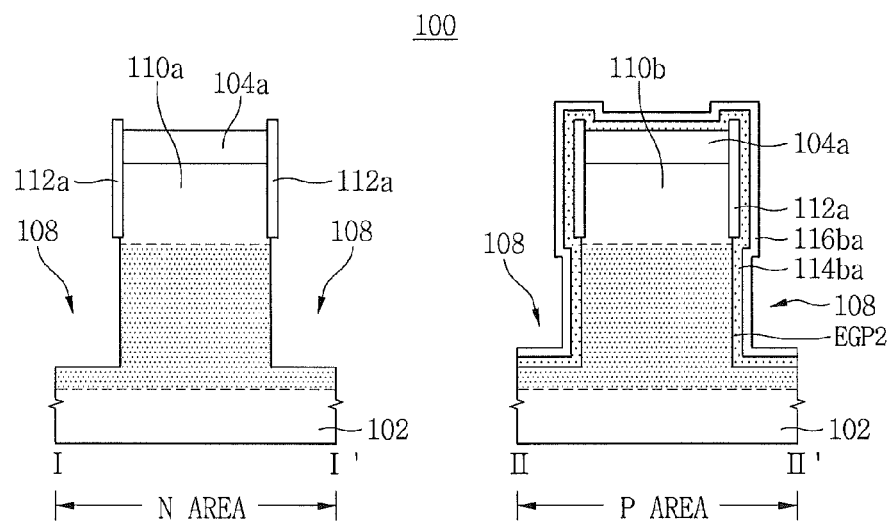
Figure 24B:
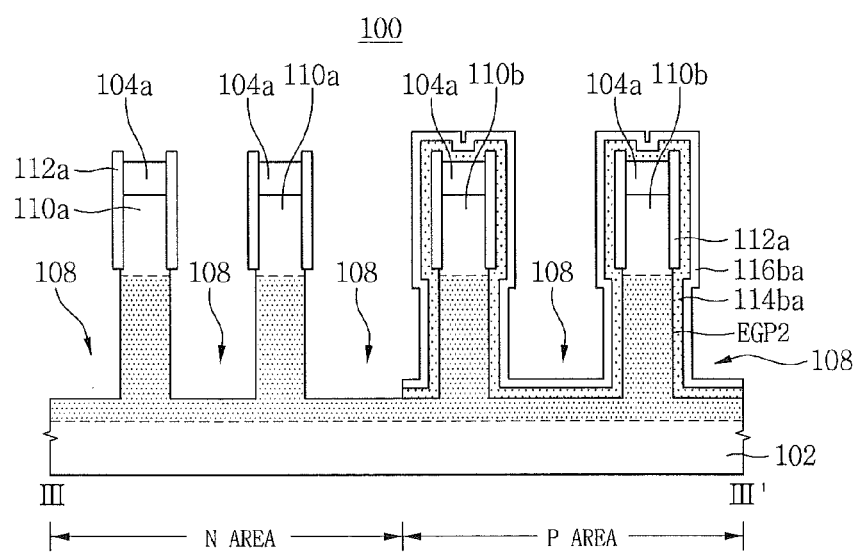

Referring to FIGS. 24A and 24B, impurities may be implanted in the extensions EGP2 of the second active fins 110b. The impurity implantation process may include diffusing phosphorus contained in the second impurity-implantation layer pattern 114ba into the extensions EGP2 of the second active fins 110b and the bottom surface of the trenches 108. In these embodiments, the substrate 102 may be heated to a high temperature of from about 600° C. to about 1000° C. By the heat of high temperature applied to the substrate 102, phosphorus contained in the second impurity-implantation layer pattern 114ba may be diffused into the second active fins 110b, and to a certain depth below the bottom surfaces of the trenches 108.

Since the doping area is limited by the spacer 112a, the implanted impurities may be distributed in a high concentration in the extensions EGP2 of the second active fins 110b in which the spacers 112a are not formed. Here, the concentration of the implanted impurities may be within the range of from about $10^{17}$ to about $10^{20}$/cm$^3$.

Figure 25A:
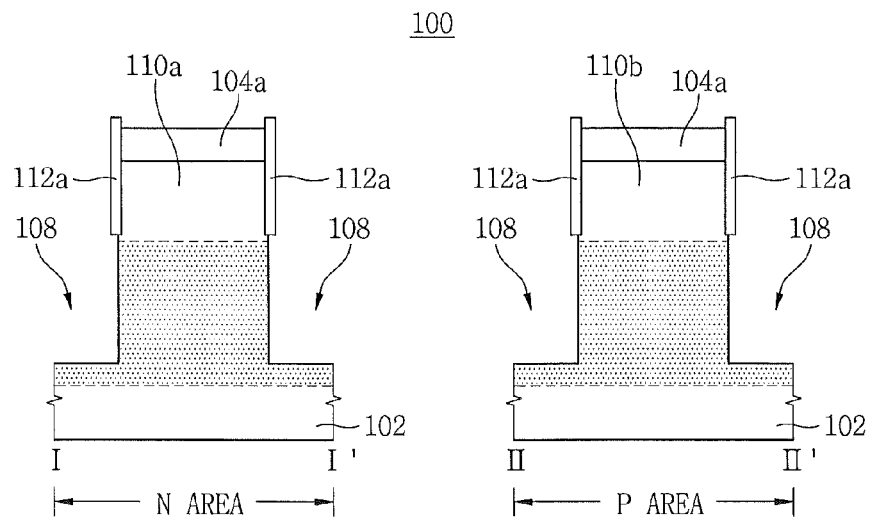
Figure 25B:
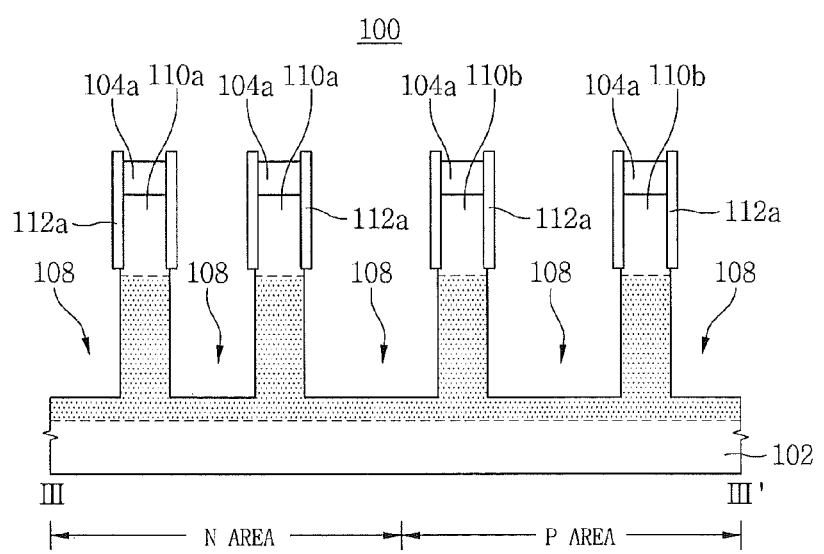

Referring to FIGS. 25A and 25B, the second impurity-implantation layer pattern 114ba and the second diffusion barrier layer pattern 116ba discussed above with respect to FIGS. 24A and 24B may be removed.

The silicon oxide patterns 104b of the first hard masks 106a formed in the P-area may be removed to expose the silicon nitride patterns 104a therebelow. Accordingly, the silicon nitride patterns 104a covering the upper surfaces of the first active fins 110a and second active fins 110b may be exposed in both the N-area and P-area. Further, the extensions EGP2 of the second active fins 110b may be in a state in which a high concentration of impurities is implanted.

Figure 26A:
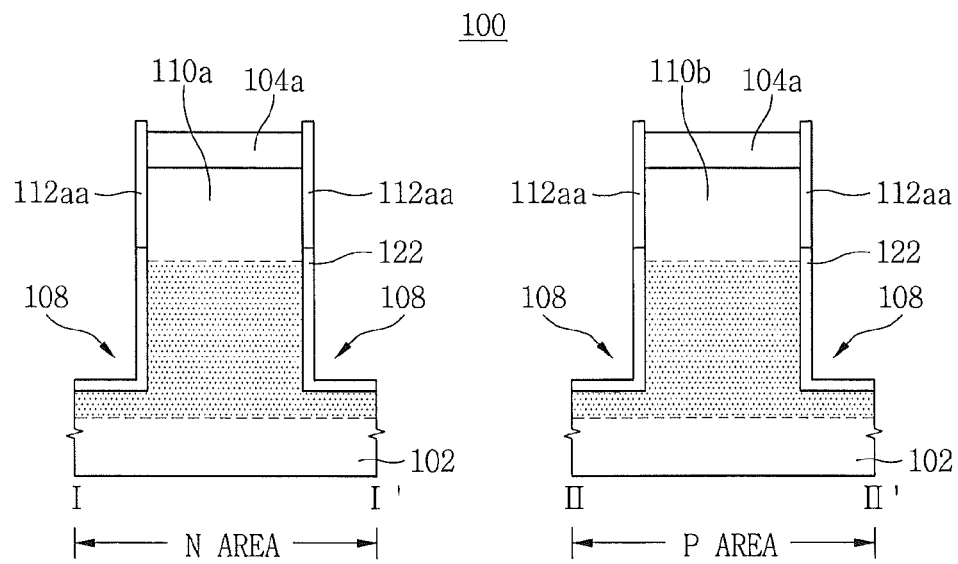
Figure 26B:
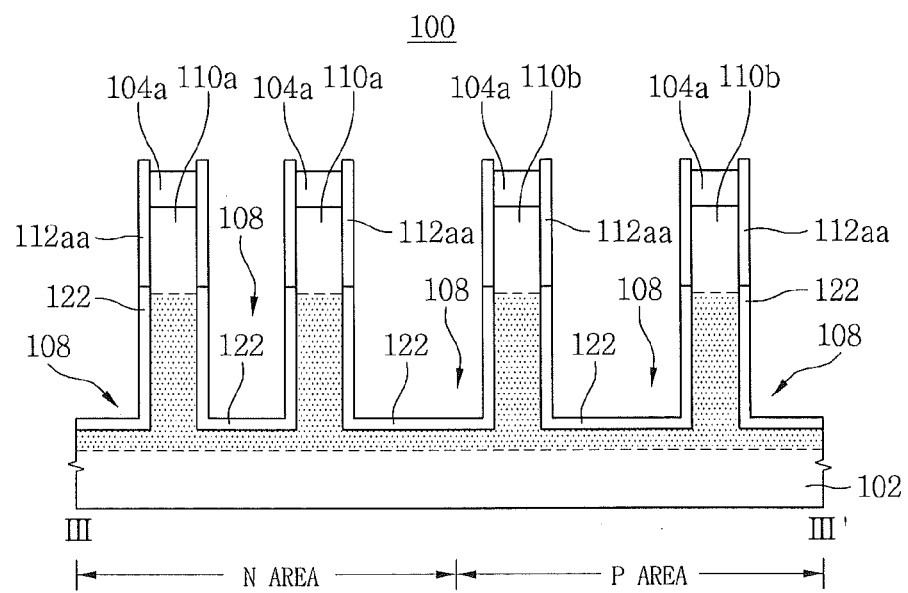

Referring to FIGS. 26A and 26B, an annealing process may be performed on the substrate 102 in which the impurity implantation process has been completed. In some embodiments, an oxidation process may be performed on the spacer 112a. Silicon lattice damage generated while implanting impurities in the silicon substrate 102 may be recovered by the annealing process. Although the impurities are diffused into areas in which the spacers 112a are formed, the diffusion area may be controlled by controlling the annealing temperature. The annealing process may be performed at a temperature selected within the range of from about 400° C. to about 1000° C. depending on process conditions.

The spacer 112a may be changed from a silicon nitride layer to a spacer oxide layer 112aa by the oxidation process. During the oxidation process, the exposed side surfaces of the first active fins 110a and second active fins 110b may be oxidized to form trench oxide layers 122. The trench oxide layers 122 may expand from the side surfaces of the first active fins 110a and second active fins 110b to the insides and outsides of the side surfaces. The spacer oxide layer 112aa and the trench oxide layer 122 may include a silicon oxide layer. The oxidation process may include a thermal oxidation process.

A semiconductor device in accordance with some embodiments of the inventive concept may be fabricated by the above-described processes. The above-described punch-through stop ion-implantation process may include a thermal diffusion process in which ions are thermally implanted. The thermal diffusion process may reduce, or possibly minimize, defects generated in surfaces and insides of the active fins while the ions are implanted.

The device may be completed using processing steps as discussed above with respect to FIGS. 11A to 13A, and FIGS. 11B to 13B. Accordingly, details with respect to these processing steps will be omitted in the interest of brevity.

Figure 27:
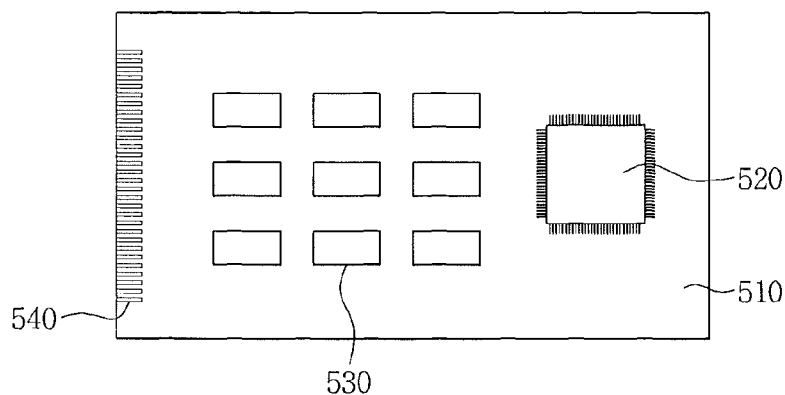
FIG. 27 is a diagram illustrating semiconductor modules including a semiconductor device fabricated in accordance with various embodiments of the inventive concept.

Referring now to FIG. 27, a schematic diagram illustrating semiconductor modules including the semiconductor device 100 fabricated in accordance with various embodiments of the inventive concept will be discussed. As illustrated in FIG. 27, a semiconductor module 500 in accordance with some embodiments of the inventive concept may include the semiconductor device 100 mounted on a semiconductor module substrate 510. The semiconductor module 500 may further include a microprocessor 520 mounted on the module substrate 510. Input/output terminals 540 may be arranged on at least one side of the module substrate 510. The semiconductor module 500 may include a memory card or a solid state drive (SSD).

Figure 28:
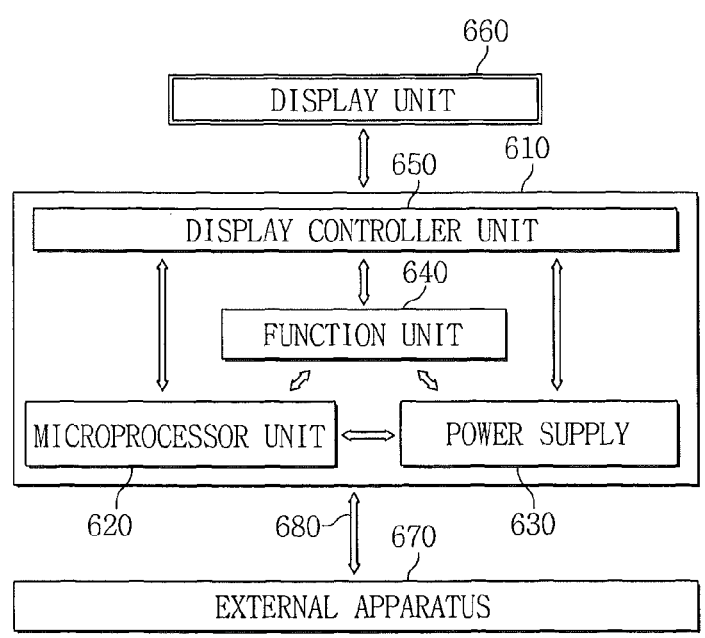
FIG. 28 is a block diagram illustrating an electronic system including a semiconductor device fabricated in accordance with various embodiments of the inventive concept.

Referring now to FIG. 28, a block diagram illustrating an electronic system including the semiconductor device 100 fabricated in accordance with various embodiments of the inventive concept will be discussed. As illustrated in FIG. 28, the semiconductor device 100 fabricated in accordance with various embodiments of the inventive concept may be applied to an electronic system 600. The electronic system 600 may include a body 610, a microprocessor unit 620, a power supply 630, a function unit 640, and a display controller unit 650. The body 610 may be a system board or motherboard formed having a printed circuit board (PCB). The microprocessor unit 620, the power supply 630, the function unit 640, and the display controller unit 650 may be mounted or installed on the body 610. A display unit 660 may be disposed on the inside or outside of the body 610. For example, the display unit 660 may be disposed on a surface of the body 610 and display an image processed by the display controller unit 650. The power supply 630 may receive a constant voltage from an external battery, etc., divide the voltage into various levels of voltages, and supply those voltages to the microprocessor unit 620, the function unit 640, and the display controller unit 650, etc. The microprocessor unit 620 may receive a voltage from the power supply 630 to control the function unit 640 and the display unit 660. The function unit 640 may perform various functions of the electronic system 600. For example, when the electronic system 600 is a mobile electronic apparatus, the function unit 640 may have several components which perform functions of a mobile phone, such as output of an image to the display unit 660 or output of a voice to a speaker, by dialing or communication with an external apparatus 670. If a camera is installed, the function unit 640 may function as a camera image processor. According to embodiments of the present inventive concept, when the electronic system 600 is connected to a memory card, etc. in order to expand capacity, the function unit 640 may be a memory card controller. The function unit 640 may exchange signals with the external apparatus 670 through a wired or wireless communication unit 680. Furthermore, when the electronic system 600 needs a universal serial bus (USB), etc. in order to expand functionality, the function unit 640 may function as an interface controller. The semiconductor devices 100 fabricated in accordance with embodiments of the inventive concept may be included to the function unit 640.

Figure 29:
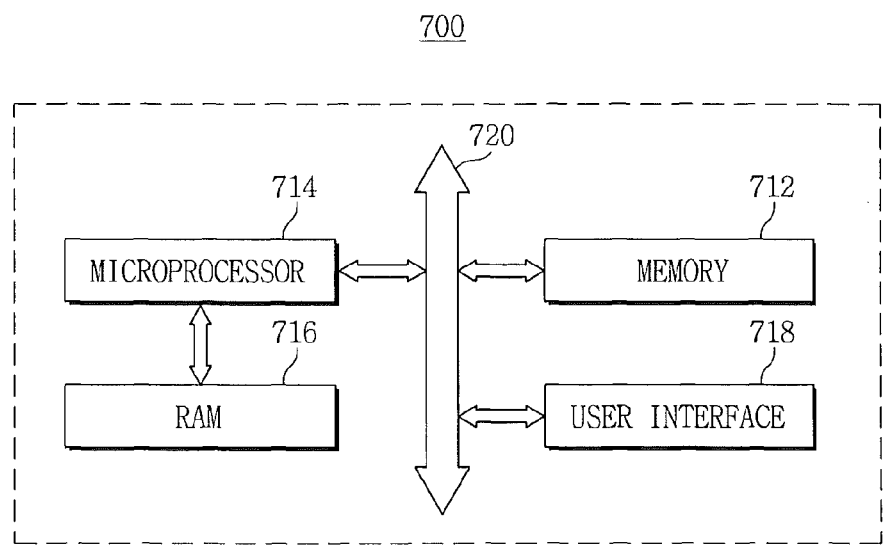
FIG. 29 is a block diagram illustrating an electronic system including a semiconductor device fabricated in accordance with various embodiments of the inventive concept.

Referring now to FIG. 29, a block diagram illustrating an electronic system including the semiconductor device 100 fabricated in accordance with various embodiments of the inventive concept will be discussed. As illustrated in FIG. 29, the electronic system 700 may include the semiconductor devices 100 fabricated in accordance with various embodiments of the inventive concept.

The electronic system 700 may be applied to a mobile electronic apparatus or a computer. For example, the electronic system 700 may include a memory system 712, a microprocessor 714, a random access memory (RAM) 716, and a user interface 718 performing data communication using a bus 720. The microprocessor 714 may program and control the electronic system 700. The RAM 716 may be used as an operation memory of the microprocessor 714. For example, the microprocessor 714 or the RAM 716 may include one of the semiconductor devices 100 fabricated in accordance with various embodiments of the inventive concept.

The microprocessor 714, the RAM 716, and/or other components can be assembled in a single package. The user interface 718 may be used to input data to, or output data from the electronic system 700. The memory system 712 may store codes for operating the microprocessor 714, data processed by the microprocessor 714, or external input data. The memory system 712 may include a controller and a memory.

Figure 30:
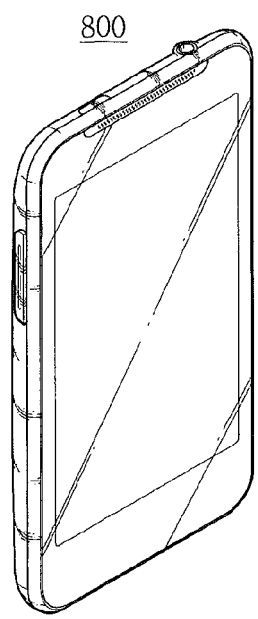
FIG. 30 is a diagram illustrating a mobile electronic apparatus including a semiconductor device in accordance with various embodiments of the inventive concept.

Referring now to FIG. 30, a diagram illustrating a mobile electronic apparatus including a semiconductor device in accordance with various embodiments of the inventive concept will be discussed. The mobile electronic apparatus 800 may be understood as a tablet PC. In addition, one of the semiconductor devices 100 fabricated in accordance with various embodiments of the inventive concept may include a portable computer such as a notebook, an MPEG-1 Audio Layer 3 (MP3) player, an MP4 player, a navigation apparatus, a solid state disk (SSD), a desktop computer, an automobile, or a home appliance, as well as the tablet PC.

As discussed briefly above with respect to the figures, semiconductor devices in accordance with embodiments of the inventive concept provide spacers on upper side surfaces of active fins, such that the impurity-implantation area may be limited in lower parts of the active fins which are not in contact with the spacers. Accordingly, since diffusion of the impurities to a surface of the active fins is reduced, or possibly minimized, the likelihood of lowering of carrier mobility in an active channel may be reduced or possibly prevented.

As further discussed, some embodiments of the present inventive concept discuss the use of a plasma ion-implantation process and a thermal diffusion process during the impurity implantation process to reduce, or possibly minimize, defects generated in surfaces and insides of the active fins during the impurity implantation process and form a high-concentration impurity area.

Finally, some embodiments of the present inventive concept include a side-etching process, such that the lower part of the active fins on which the spacers are not formed may be formed to have a small width. Accordingly, a high-concentration impurity area may be formed in the lower part of the active fins on which the spacers are not formed, in a relatively short amount of time.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a semiconductor device, comprising:
    providing a substrate having a first region and a second region, the substrate defining trenches in the first and second regions;
    forming active fins on the first and second regions, the active fins protruding from the trenches in the first and second regions;
    forming spacers on sidewalls of the active fins in the first and second regions;
    recessing floors of the trenches under the spacers to provide extensions of the active fins;
    implanting impurities of a first type in the extensions of the active fins in the first region; and
    implanting impurities of a second type, different from the first type, in the extensions of the active fins in the second region.

2. The method of claim 1, wherein forming of the trenches and the active fins comprises:
    forming a nitride layer and an oxide layer on the nitride layer such that the nitride layer and the oxide layer are sequentially stacked on the first and second regions to provide hard mask patterns on the first and second regions; and etching the substrate to provide the trenches and the protruding active fins using the hard mask patterns as an etch mask.

3. The method of claim 2, wherein forming of the spacers comprises:
forming a spacer layer covering the hard mask patterns, the active fins, and the floors surfaces of the trenches; and
etching the spacer layer to expose upper surfaces of the hard mask patterns and the floors of the trenches.

4. The method of claim 1:
wherein the first region comprises one of a p-channel area and an n-channel area; and
wherein the second region comprises a different one of a p-channel area and an n channel area.

5. The method of claim 4:
wherein the first region comprises the n-channel area; and
wherein implanting of the impurities of the first type comprises implanting p-type impurities in the extensions of the active fins in the first region.

6. The method of claim 5:
wherein the second region comprises the p-channel area; and
wherein implanting impurities of the second type comprises implanting n-type impurities in the extensions of the active fins in the second region.

7. The method of claim 1, wherein implanting impurities of the first and second type comprises implanting impurities of the first and second type using a plasma ion-implantation process.

8. The method of claim 1, wherein the spacer comprises a silicon nitride layer.

9. The method of claim 8, further comprising:
performing an oxidation process on the spacer to provide a spacer oxide layer; and
forming a trench oxide layer by an oxidation process on side surfaces of the extensions of the active fins.

10. The method of claim 1, further comprising etching side surfaces of the extensions of the active fins to have a concave shape.

11. A method of fabricating a semiconductor device, comprising:
providing a substrate having a first region and a second region, the substrate defining trenches in the first and second regions;
forming active fins on the first and second regions, the active fins protruding from the trenches in the first and second regions;
forming spacers covering sidewalls of the active fins;
recessing floors of the trenches under the spacers to provide extensions of the active fins;
forming a first impurity-implantation layer pattern and a first diffusion barrier layer pattern on the first impurity-implantation layer pattern to cover the active fins and trenches in the first region;
implanting first impurities in the extensions of the active fins in the first region;
forming a second impurity-implantation layer pattern and a second diffusion barrier layer pattern on the second impurity-implantation layer pattern to cover the active fins and trenches in the second region; and
implanting second impurities, different from the first impurities, in the extensions of the active fins in the second region.

12. The method of claim 11, wherein forming the first impurity-implantation layer pattern and the first diffusion barrier layer pattern comprises:
conformally forming a first impurity-implantation layer on the first and second regions;
forming a first diffusion barrier layer on an upper surface of the first impurity-implantation layer;
forming an etch stopping layer covering the first region;
removing the first impurity-implantation layer and the first diffusion barrier layer in the second region; and
forming the first impurity-implantation layer pattern and the first diffusion barrier layer pattern under the etch stopping layer.

13. The method of claim 11, wherein implanting the first impurities includes diffusing impurities included in the first impurity-implantation layer pattern into the extensions of the active fins by applying heat to the substrate.

14. The method of claim 11:
wherein the first impurity-implantation layer comprises one of a phosphosilicate glass (PSG) layer and a borosilicate glass (BSG) layer; and
wherein the second impurity-implantation layer comprises a different one a phosphosilicate glass (PSG) layer and a borosilicate glass (BSG) layer.

15. The method of claim 11, wherein the first and second diffusion barrier layers include silicon oxide layers.

16. A method of fabricating a semiconductor device, comprising:
providing a substrate having a first region and a second region, the substrate defining trenches in the first and second regions;
forming active fins on the first and second regions, the active fins protruding from the trenches in the first and second regions;
forming spacers on upper side surfaces of the active fins such that an impurity-implantation area is limited to lower portions of the active fins that are not covered by the spacers, wherein presence of the spacers on the upper side surfaces of the active fins reduces diffusion of impurities to a surface of the active fins;
implanting first impurities in extensions of the active fins in the first region; and
implanting second impurities, different from the first impurities, in the extensions of the active fins in the second region,
wherein the implanting of the first and second impurities comprises implanting using plasma ion-implantation and a thermal diffusion process.

17. The method of claim 16, wherein defects generated in surfaces and insides of the active fins during the implanting are reduced by the use of plasma ion-implantation and thermal diffusion process.

18. The method of claim 16, wherein the lower portions of the active fins have a relatively small width.

19. The method of claim 18, further comprising a high-concentration impurity area in the lower portions of the active fins.

* * * * *